(12) United States Patent
Ding et al.

(10) Patent No.: US 9,788,468 B2
(45) Date of Patent: Oct. 10, 2017

(54) CAGE ASSEMBLY FOR ELECTRICAL DEVICES

(71) Applicant: Tyco Electronics (Shanghai) Co. Ltd., Shanghai (CN)

(72) Inventors: Weixiang Ding, Shanghai (CN); Jian Zhou, Shanghai (CN); Hongwen Yang, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 199 days.

(21) Appl. No.: 14/725,625

(22) Filed: May 29, 2015

(65) Prior Publication Data
US 2015/0351259 A1 Dec. 3, 2015

(30) Foreign Application Priority Data
May 30, 2014 (CN) .......................... 2014 1 0239274

(51) Int. Cl.
| | | |
|---|---|---|
| H05K 5/00 | (2006.01) | |
| H05K 9/00 | (2006.01) | |
| H01R 13/6581 | (2011.01) | |

(52) U.S. Cl.
CPC ....... H05K 9/0058 (2013.01); H01R 13/6581 (2013.01)

(58) Field of Classification Search
CPC .......... H05K 5/02; H05K 5/00; H05K 5/0217; H05K 5/0247; H05K 5/04; H05K 9/0058; H02G 3/08; H02G 3/081; H02G 3/086; H01R 13/46; H01R 13/514; H01R 13/6581

USPC .......... 174/50, 520, 559, 560, 561; 361/600, 361/601, 729, 730, 679.01, 748, 753; 439/540.1, 541.5, 607.27, 76.1, 76.2

See application file for complete search history.

(56) References Cited

U.S. PATENT DOCUMENTS

| | | | | | |
|---|---|---|---|---|---|
| 4,165,443 | A | * | 8/1979 | Figart | H02G 3/16 174/53 |
| 4,612,412 | A | * | 9/1986 | Johnston | H02G 3/086 174/57 |
| 6,100,468 | A | * | 8/2000 | Niggl | H05K 7/1447 174/535 |
| 8,053,667 | B2 | * | 11/2011 | Chen | H05K 9/0058 174/50 |
| 8,182,290 | B2 | * | 5/2012 | Fonteneau | H05K 9/0058 439/607.21 |
| 8,426,751 | B2 | * | 4/2013 | Lee | H01R 13/506 174/520 |
| 8,747,159 | B2 | * | 6/2014 | Liu | G02B 6/428 439/607.2 |

FOREIGN PATENT DOCUMENTS

CN 200910150977.0 3/2004

* cited by examiner

*Primary Examiner* — Angel R Estrada
(74) *Attorney, Agent, or Firm* — Barley Snyder

(57) ABSTRACT

A housing assembly for electronic devices has a base housing and a first secondary housing. The base housing has a first upper wall, a first lower wall, a first wall, a second wall, and a first device receiving space. The first secondary housing is detachably mounted to an outer side of the second wall, and has a second upper wall, a second lower wall, a connecting wall, and a second device receiving space defined by the second wall together with the second upper wall, the second lower wall and the connecting wall of the first secondary housing.

20 Claims, 21 Drawing Sheets

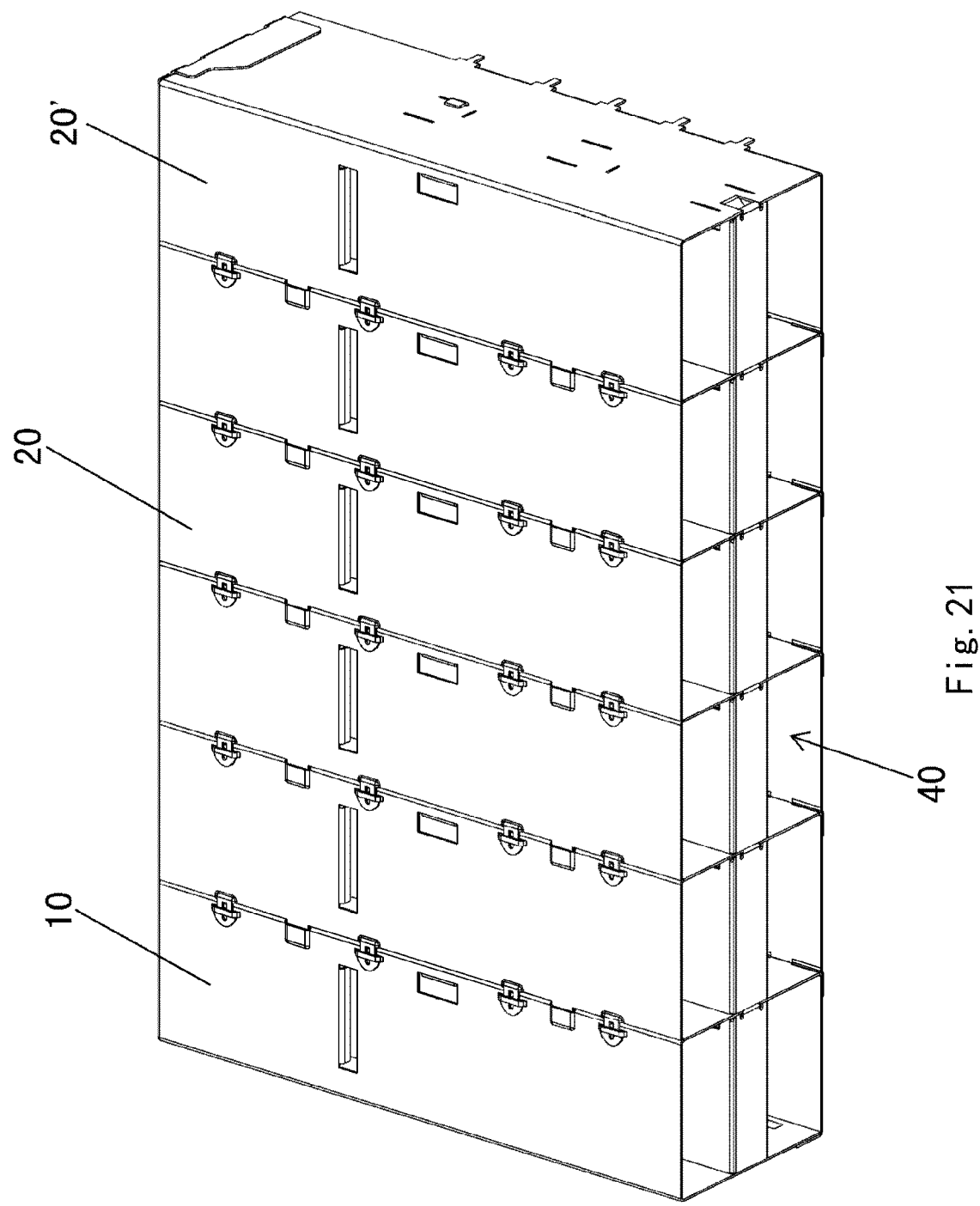

CAGE ASSEMBLY FOR ELECTRICAL DEVICES

CROSS-REFERENCE TO RELATED APPLICATION

This application claims priority under 35 U.S. §119(a)-(d) or (f) to Chinese Patent Application No. 201410239274.6 filed on May 30, 2014.

FIELD OF THE INVENTION

The invention is generally related to an insulating housing for electronic devices, and, more specifically, to a modular insulating housing.

BACKGROUND

Traditionally, electronic devices, such as electrical connectors, fiber optic connectors, photoelectric transducers, and so on, are inserted in an insulating housing made of a metal plate to protect and to electrically shield the inserted electronic devices. In order to facilitate the insertion of a plurality of electronic devices together in a limited space, generally one horizontal partition plate and a plurality of vertical partition plates are positioned in the interior of one metal housing, forming two rows and a plurality of columns having a plurality of device receiving spaces. Namely 2×N device receiving spaces are formed, and in each of which one electronic device may be inserted.

In applications requiring a number of differently sized 2×N device receiving spaces, different insulating housings are needed, such as 2×2, 2×3, 2×5, etc., device receiving spaces, in different applications. To provide these differently sized device receiving spaces in an insulating housing, it is necessary to develop several sets of molds to manufacture the insulating housings. Additionally, molds for manufacturing the horizontal partition plates and vertical partition plates are also required, thus increasing the manufacturing and assembly costs, making it difficult to achieve low cost and flexible manufacturing processes.

SUMMARY

A housing assembly for electronic devices has a base housing and a first secondary housing. The base housing has a first upper wall, a first lower wall, a first wall, a second wall, and a first device receiving space. The first secondary housing is detachably mounted to an outer side of the second wall, and has a second upper wall, a second lower wall, a connecting wall, and a second device receiving space defined by the second wall together with the second upper wall, the second lower wall and the connecting wall of the first secondary housing.

BRIEF DESCRIPTION OF THE DRAWINGS

The invention will now be described by way of example, with reference to the accompanying Figures, of which:

FIG. 21 is a perspective view of a sixth housing assembly.

DETAILED DESCRIPTION

Figure 1:
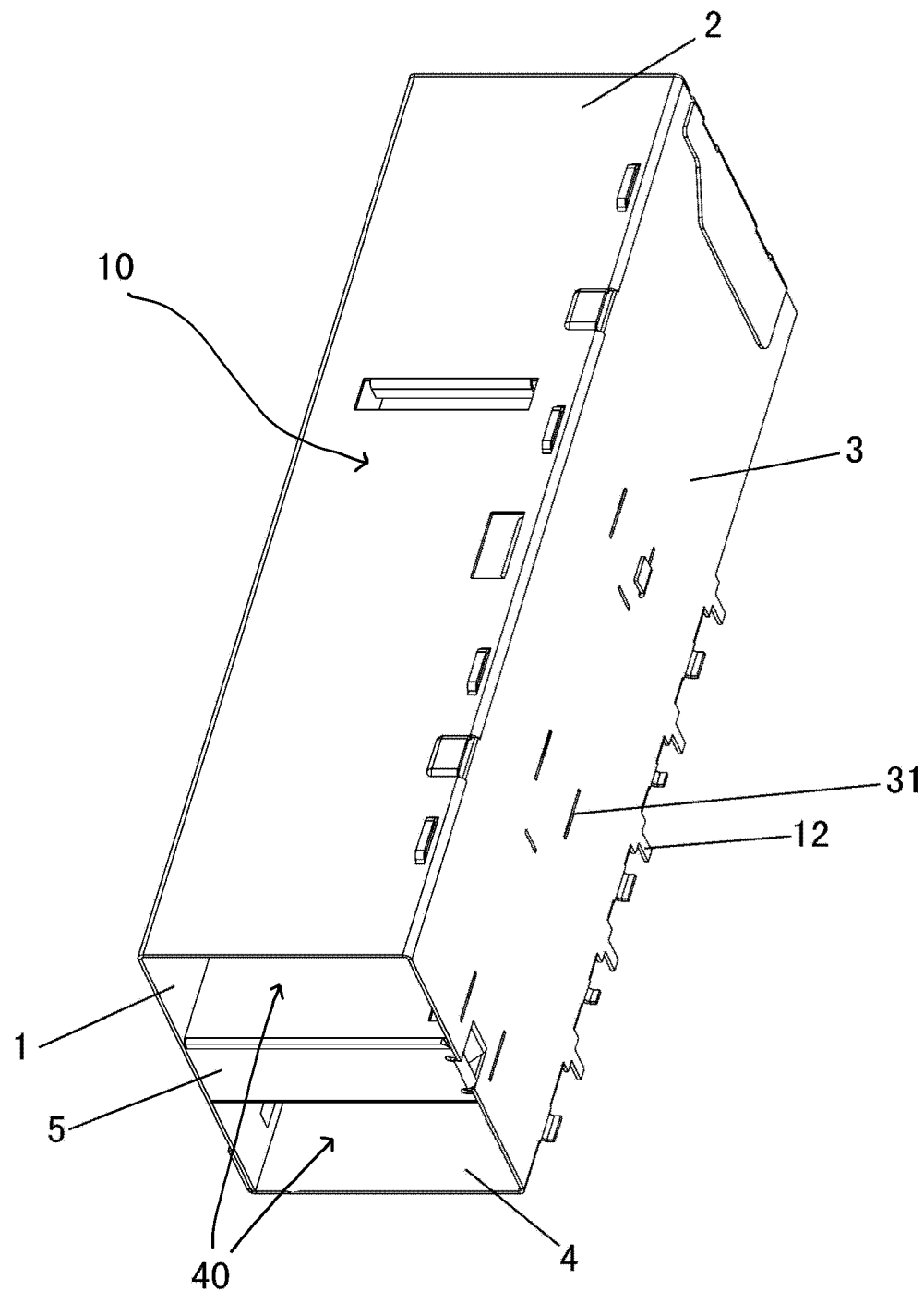
FIG. 1 is a perspective view of a first housing assembly.

Exemplary embodiments of the invention will be described hereinafter in detail with reference to the attached drawings, wherein like reference numerals refer to like elements. The invention may, however, be embodied in many different forms and should not be construed as being limited to the embodiment set forth herein. Rather, these embodiments are provided so that the disclosure will be thorough and complete, and will fully convey the concept of the disclosure to those skilled in the art.

It is noted that, to facilitate description, the orientations of upper, lower, left, right etc. in the invention are defined in a case where an observer faces a receiving end of the housing assembly, the receiving end receiving an inserted electronic device, and where pins for connecting to a circuit board are positioned to extend downward. It is appreciated for the person skilled in the art that those orientations will change accordingly as the posture of the housing assembly changes. However, the relative position relationship between all constituent parts is constant.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
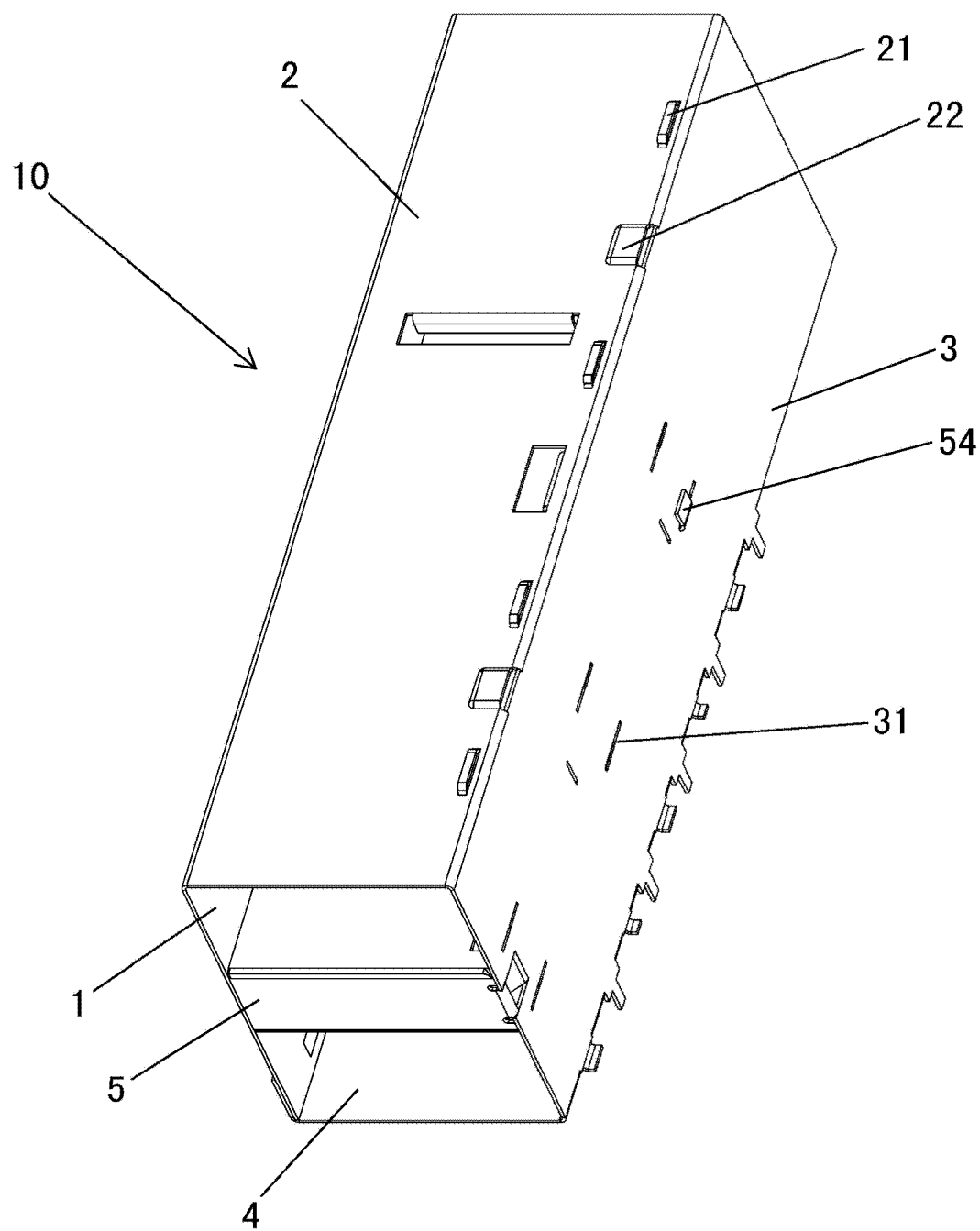
FIG. 2 is a perspective view of a receiving end of a base housing of the housing assembly of FIG. 1.
Figure 3:
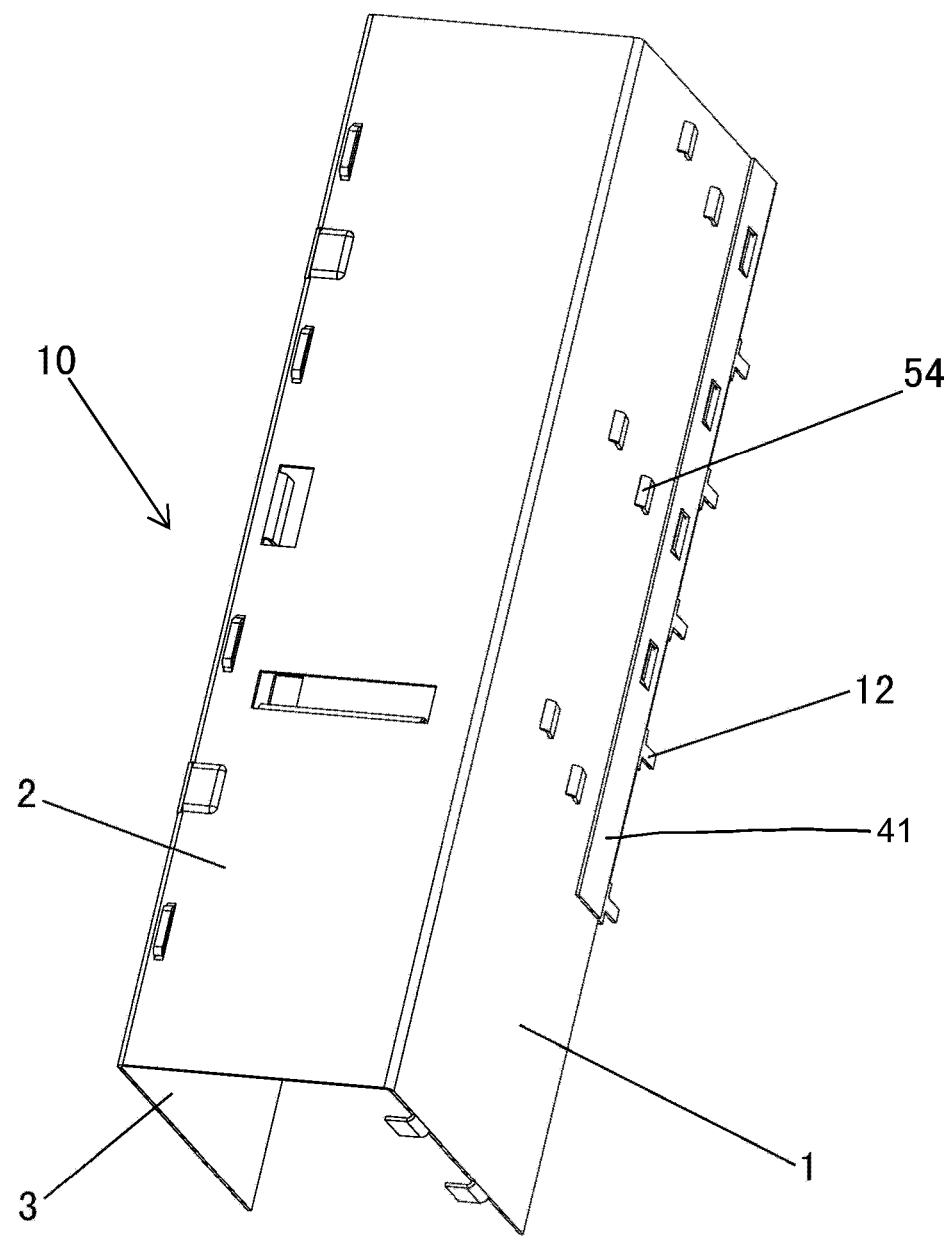
FIG. 3 is a perspective view of a terminating end of the base housing of FIG. 2.

In the embodiments shown in FIGS. 1-3, a housing assembly 100 has a first wall 1 (also referred to as a left wall), a first upper wall 2, a second wall 3 (also referred to as a right wall), and a first lower wall 4, which are successive and integrally connected; and a first partition 5, which is supported at an approximate middle position between the first upper wall 2 and the first lower wall 4 by the first wall 1 and the second wall 3. The first partition 5 divides the interior of the base housing 10 into an upper device receiving space 40 and a lower device receiving space 40 for receiving the electronic devices.

Figure 4:
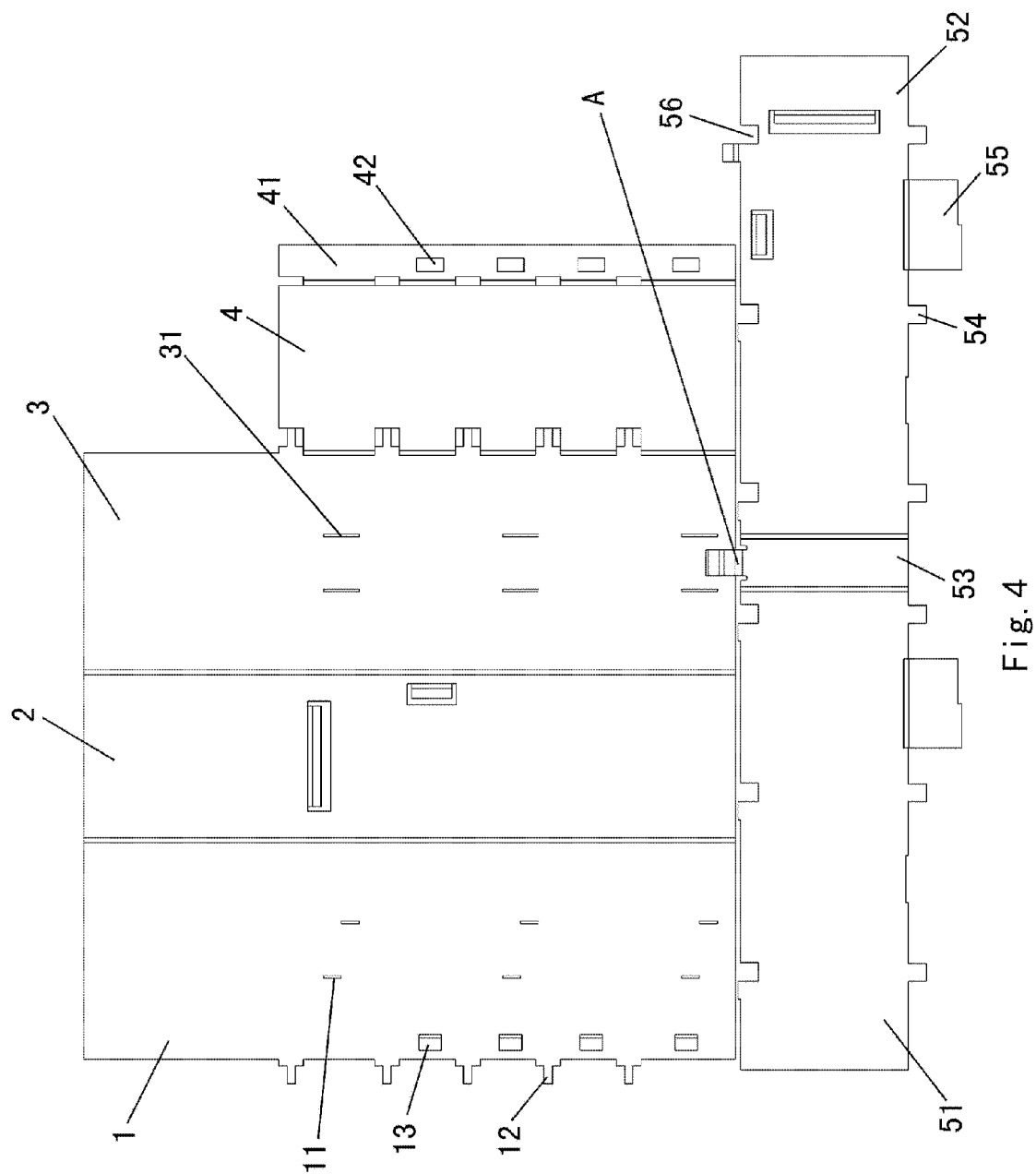
FIG. 4 is a plan view of a metal sheet for manufacturing the base housing of FIG. 2, prior to being folded.

The first partition 5 has an approximate U-shape, and, as shown in FIG. 4, includes: a first upper partition wall 51, a first lower partition wall 52, and a first partition connecting wall 53 that connects the first upper partition wall 51 with the first lower partition wall 52. The first partition connecting wall 53 is formed by bending perpendicularly inward from one of the first wall 1 and the second wall 3. In the embodiment shown in FIGS. 1-3, the housing assembly 100 has a base housing 10 with 2×1 device receiving spaces 40 that may receive two electronic devices.

In an embodiment shown in FIG. 4, a process for manufacturing the base housing 10 comprises the steps of: providing a first metal sheet, such as copper, stainless steel, and so on; cutting the first metal sheet into a first portion at an upper portion and a second portion at the lower portion such that the second portion is integrally connected with the first portion at position A of the first partition connecting wall 53; forming the first wall 1, the first upper wall 2, the second wall 3 and the first lower wall 4, which are successively connected by forming indentations or punching on the first portion; forming the first upper partition wall 51, the first partition connecting wall 53 and the first lower partition wall 52, which are successively connected, by forming indentations on the second portion; bending the first upper partition wall 51 and the first lower partition wall 52 perpendicularly at respective indentation positions with respect to the first partition connecting wall 53, such that the first partition 5 is formed in an approximate U-shape; bending the first partition connecting wall 53 at the connection position (i.e., position A) between the first portion and the second portion, such that sides of the first upper partition wall 51 and the first lower partition wall 52 are rested against and supported on the second wall 3; and folding the first upper wall 2, the first wall 1 and the first lower wall 4 such that the other sides of the first upper partition wall 51 and the first lower partition wall 52 are rested against and supported on the first wall 1, and the free sides of the first wall 1 and the first lower wall 4 are connected with each other, to thereby form the base housing 10.

In the base housing 10, the first wall 1, the first upper wall 2, the second wall 3 and the first lower wall 4 are successively connected. Additionally, the first upper partition wall 51, the first partition connecting wall 53 and the first lower partition wall 52 are successively connected, and the first partition connecting wall 53 is connected integrally with one of the first wall 1 and the second wall 3. Thus, the base housing 10 may be made of a single sheet of metal sheet by cutting, punching, folding, and/or bending with a simple manufacturing process, reducing manufacturing cost.

In the embodiment shown FIGS. 1-4, a plurality of first protrusions 54 extending horizontally outward are positioned on sides of the first upper partition wall 51 and the first lower partition wall 52, respectively. A plurality of first protrusion receiving holes 11 are disposed on the first wall 1, and a plurality of first protrusion receiving holes 31 are disposed on the second wall 3, into each of which one corresponding first protrusion 54 is inserted. To ensure a stable connection, the exposed first protrusion 54 may be bent after the first protrusion 54 has passed through the first wall 1 or the second wall 3, to prevent the first protrusion 54 from being disengaged from the first protrusion receiving holes 11,31.

Figure 15:
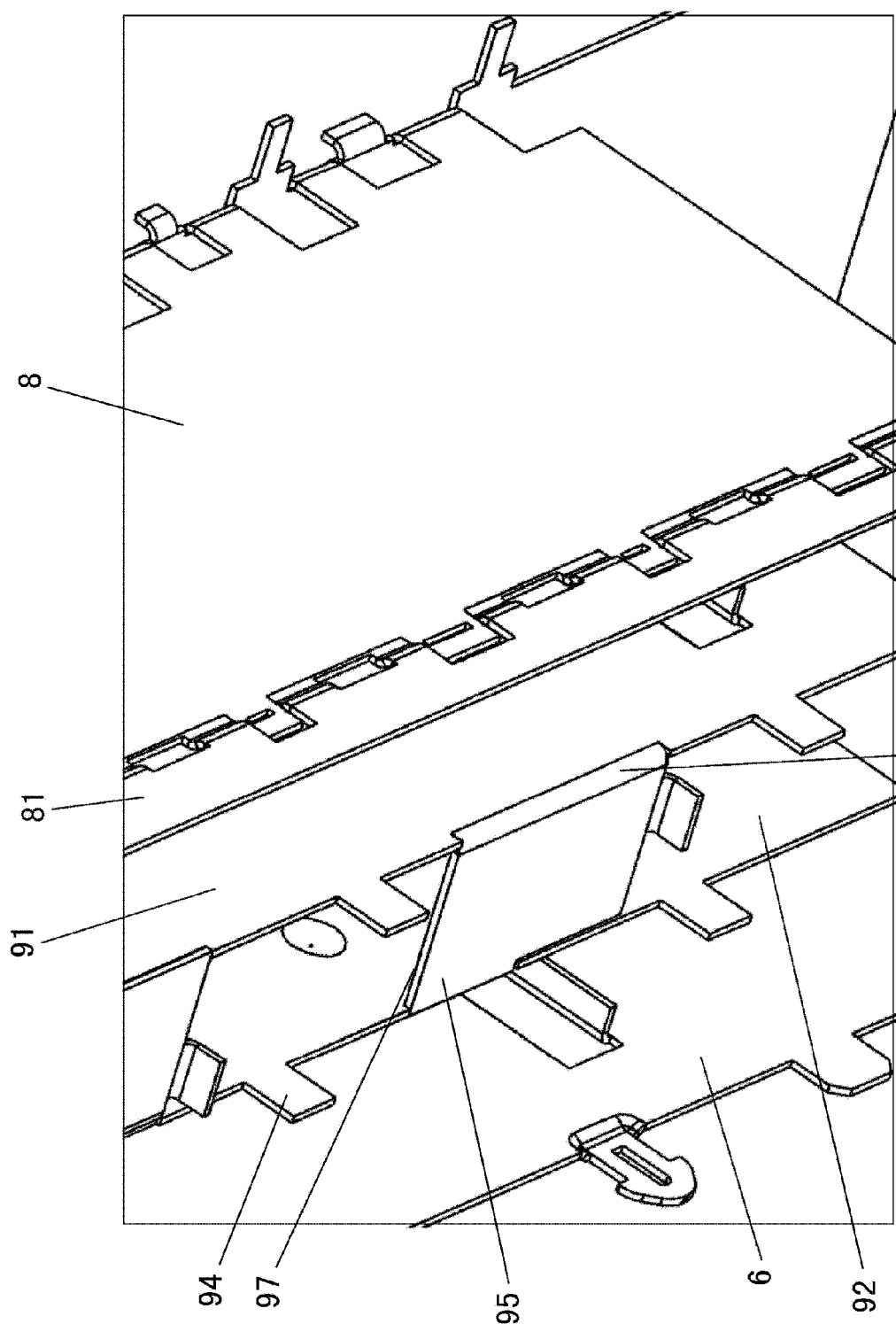
FIG. 15 is a partially enlarged view of the secondary housing of FIG. 12.

In the embodiment of FIG. 3, first sides of the first upper partition wall 51 and the first lower partition wall 52 are provided with at least one first partition reinforcing bridge 55, which extends perpendicularly from either the first upper partition wall 51 or the first lower partition wall 52, towards the other of the first upper partition wall 51 or the first lower partition wall 52, to horizontally support the first upper partition wall 51 and the first lower partition wall 52. More specifically, referring to FIG. 15 (to be described in detail hereafter), a free end of the first partition reinforcing bridge 55 further extends perpendicularly to abut against an outer side of the other of the first upper partition wall 51 or the first lower partition wall 52, and both sides of the first partition reinforcing bridge 55 extend perpendicularly inward so that the first partition reinforcing bridge 55 is supported between the first upper partition wall 51 and the first lower partition wall 52. Thus, a predetermined distance between the first upper partition wall 51 and the first lower partition wall 52 may be kept by the first partition reinforcing bridge 55, to radiate heat generated from the electronic devices mounted in the device receiving spaces 40.

In the embodiments shown in FIGS. 1-4, a plurality of first pins 12 extend outward from the first lower wall 4, being positioned on the bottom of the first wall 1 and the second wall 3, respectively. The base housing 10 may be mounted on the circuit board (not shown) by welding or inserting the first pins 12 to the circuit board.

In the embodiments shown in FIGS. 3 and 4, a free edge the first lower wall 4 has a folded edge 41 that rests against an outer side of the first wall 1. Further, a plurality of first engaging slots 42 are disposed on the folded edge 41, and a plurality of first engaging protrusions 13 for snap-fitting with the first engaging slots 41 are positioned on the first wall 1. Thus, the folded edge 41 is coupled with the outer side of the first wall 1 when the first wall 1, the first upper wall 2, the second wall 3, and the first lower wall 4 are bent or folded successively to form an approximate cuboidal shape, thereby achieving structural stability of the base housing 10. In an embodiment (not shown), the first engaging slots may be disposed on the first wall 1, while the corresponding first engaging protrusions may be positioned on the folded edge 41, thereby the engagement between the folded edge 41 and the first wall 1 is also achieved.

Figure 5:
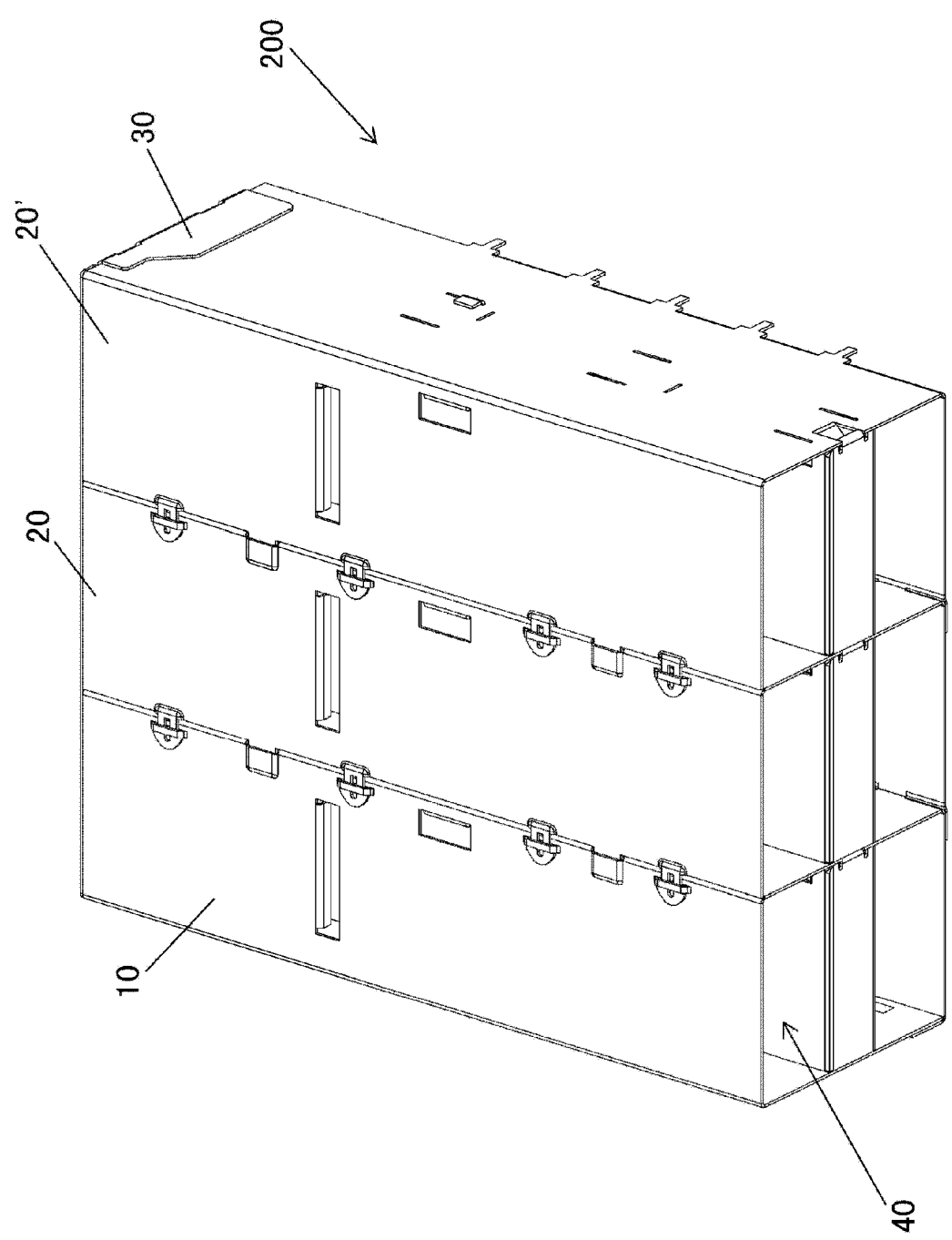
FIG. 5 is a perspective view of a second housing assembly.
Figure 6:
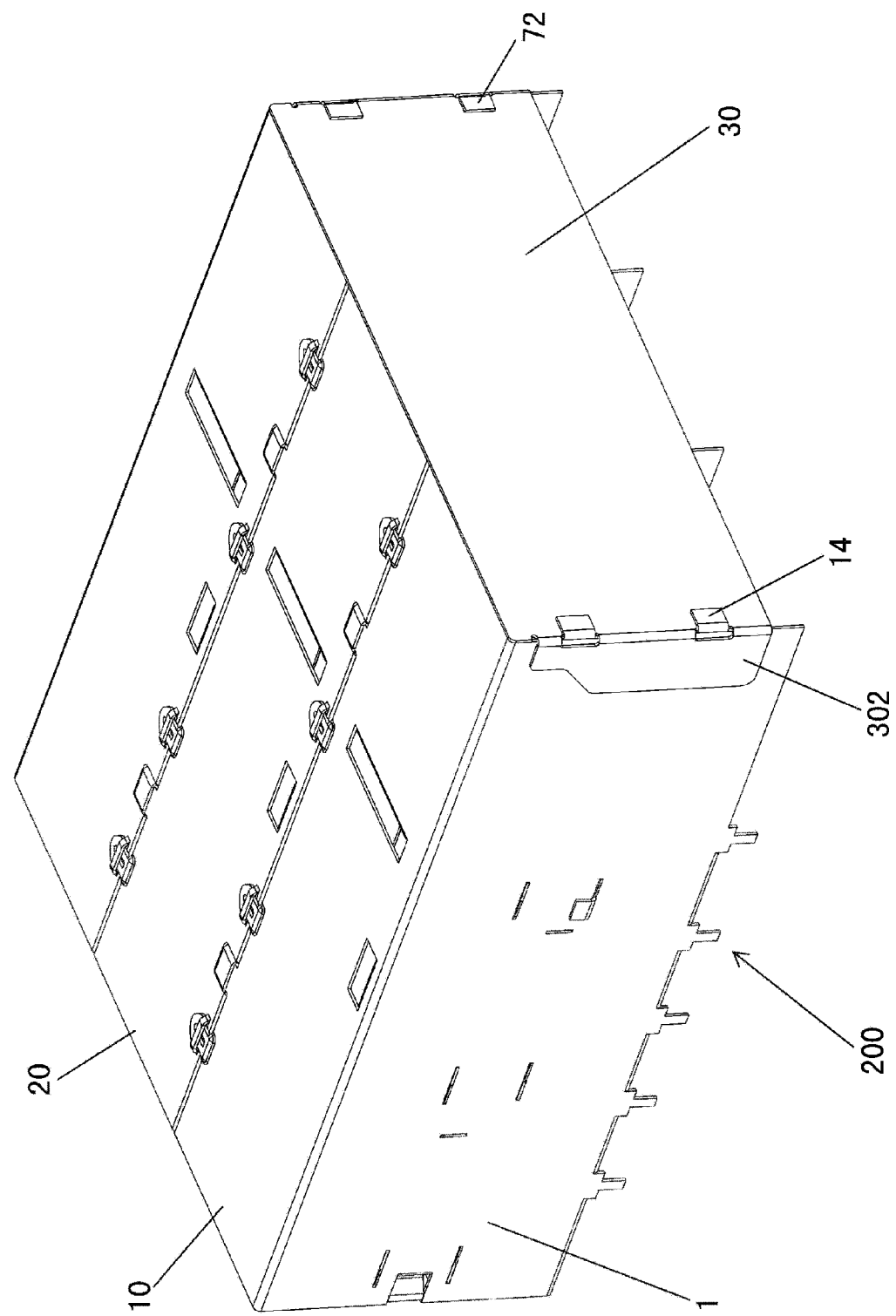
FIG. 6 a perspective view of a terminating end of the housing assembly of FIG. 5.

In an embodiment shown in FIGS. 5 and 6, a housing assembly 200 includes the base housing 10, a first secondary housing 20, and a second secondary housing 20'. Therefore, the housing assembly 200 has device receiving spaces 40 arranged in two rows and three columns, i.e. 2×3 device receiving spaces. The first secondary housing 20 is detachably connected to the base housing 10 on the outer side of the second wall 3 of the base housing 10, and the second secondary housing 20' is detachably connected with the first secondary housing 20.

In the embodiments shown in FIGS. 5-7 and 12-15, each secondary housing 20,20' comprises a successive and integrally connected second upper wall 6, connecting wall 7, and second lower wall 8. Each secondary housing 20,20' further comprises a second partition 9. Free ends of the second upper wall 6 and the second lower wall 8 are connected to the first upper wall 2 and the first lower wall 4 of the base housing 10, respectively. The free ends of the second upper wall 6 and the second lower wall 8 of the second secondary housing 20' are connected to the second upper wall 6 and the second lower wall 8 of the first secondary housing 20, respectively. The second partition 9 is supported at an approximate middle position between the second upper wall 6 and the second lower wall 8 by the connecting wall 7, and the first second wall 3 of the base housing 10 or the connecting wall 7 of the previous secondary housing, to divide the interior of the secondary housing into two device receiving spaces 40. The second partition 9 is approximately U-shaped, and includes: a second upper partition wall 91, a second lower partition wall 92, and a second partition connecting wall 93 connecting the second upper partition wall 91 with the second lower partition wall 92. The second partition connecting wall 93 is formed by bending perpendicularly inward from the connecting wall 7.

Each secondary housing 20,20' comprises 2×1 device receiving spaces 40, and may receive two electronic devices. Thus, in general, if a housing assembly according to any of the embodiments disclosed herein comprises one base housing 10 and (N−1) secondary housings 20, then the housing assembly has 2×N device receiving spaces 40, wherein N is a natural number.

Figure 16:
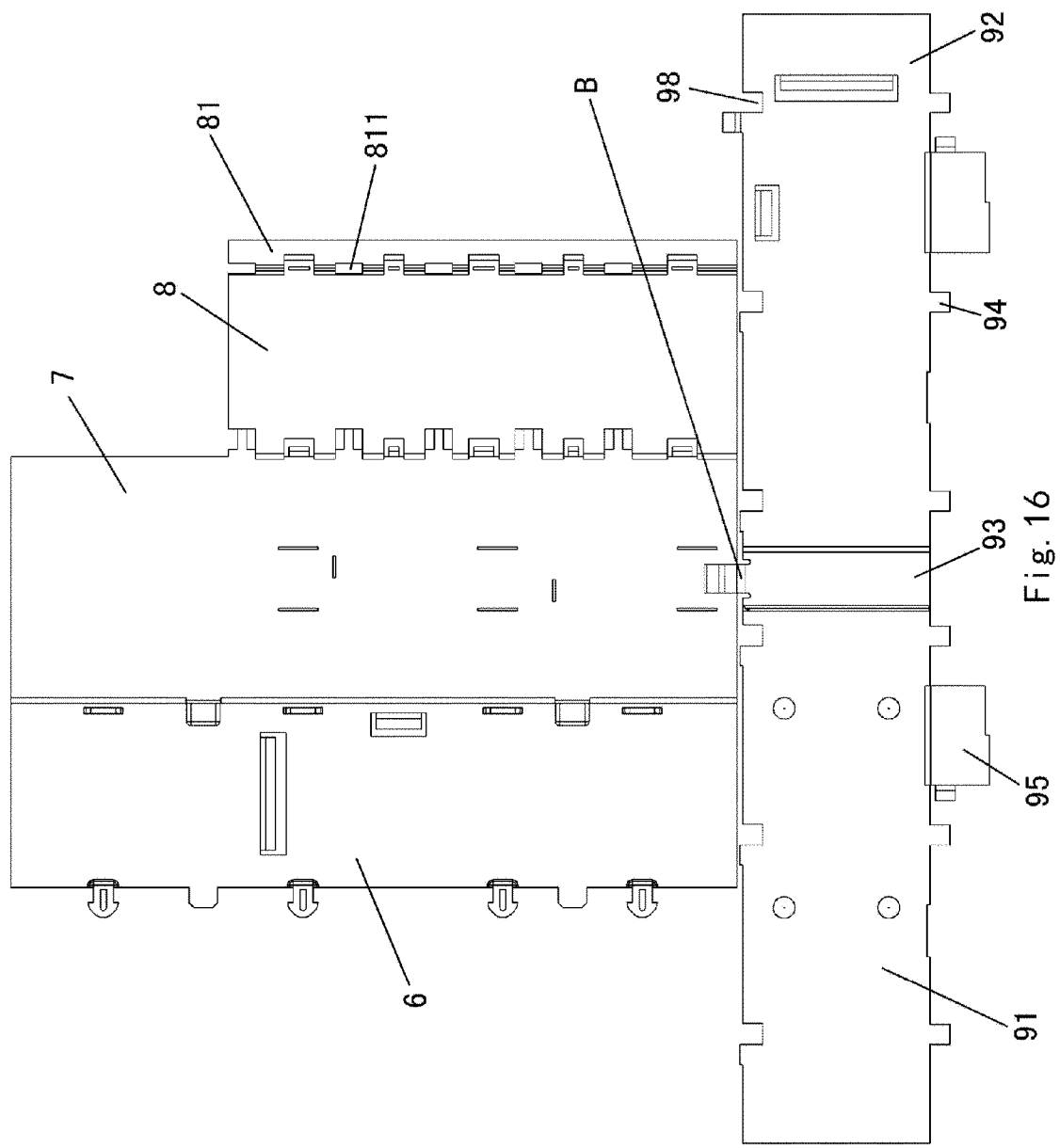
FIG. 16 is a plan view of a metal sheet prior to folding from which the secondary housing is formed.

In an embodiment shown in FIG. 16, the process for manufacturing the secondary housing 20, 20' comprises the steps of: providing a second metal sheet; cutting the second metal sheet into a third portion and a fourth portion, wherein the fourth portion is integrally connected with the third portion at the position B of the second partition connecting wall 93; forming the successively connected second upper wall 6, connecting wall 7 and second lower wall 8 by forming indentations on the third portion; forming the successively connected second upper partition wall 91, second partition connecting wall 93, and second lower partition wall 92 by forming indentations on the fourth portion; bending the second upper partition wall 91 and the second lower partition wall 92 perpendicularly with respect to the second partition connecting wall 93; bending the second partition connecting wall 93 at the connection position (i.e., position B) between the third portion and the fourth portion, such that sides of the second upper partition wall 91 and the second lower partition wall 92 are supported on the connecting wall 7; folding the second upper wall 6, and the second lower wall 8, thereby forming the secondary housing 20,20'. Further, the second upper wall 6 and the second lower wall 8 of the secondary housing 20 are coupled with the first upper wall 2 and the first lower wall 4 on the second wall 3 of the base housing 10, respectively.

Figure 7:
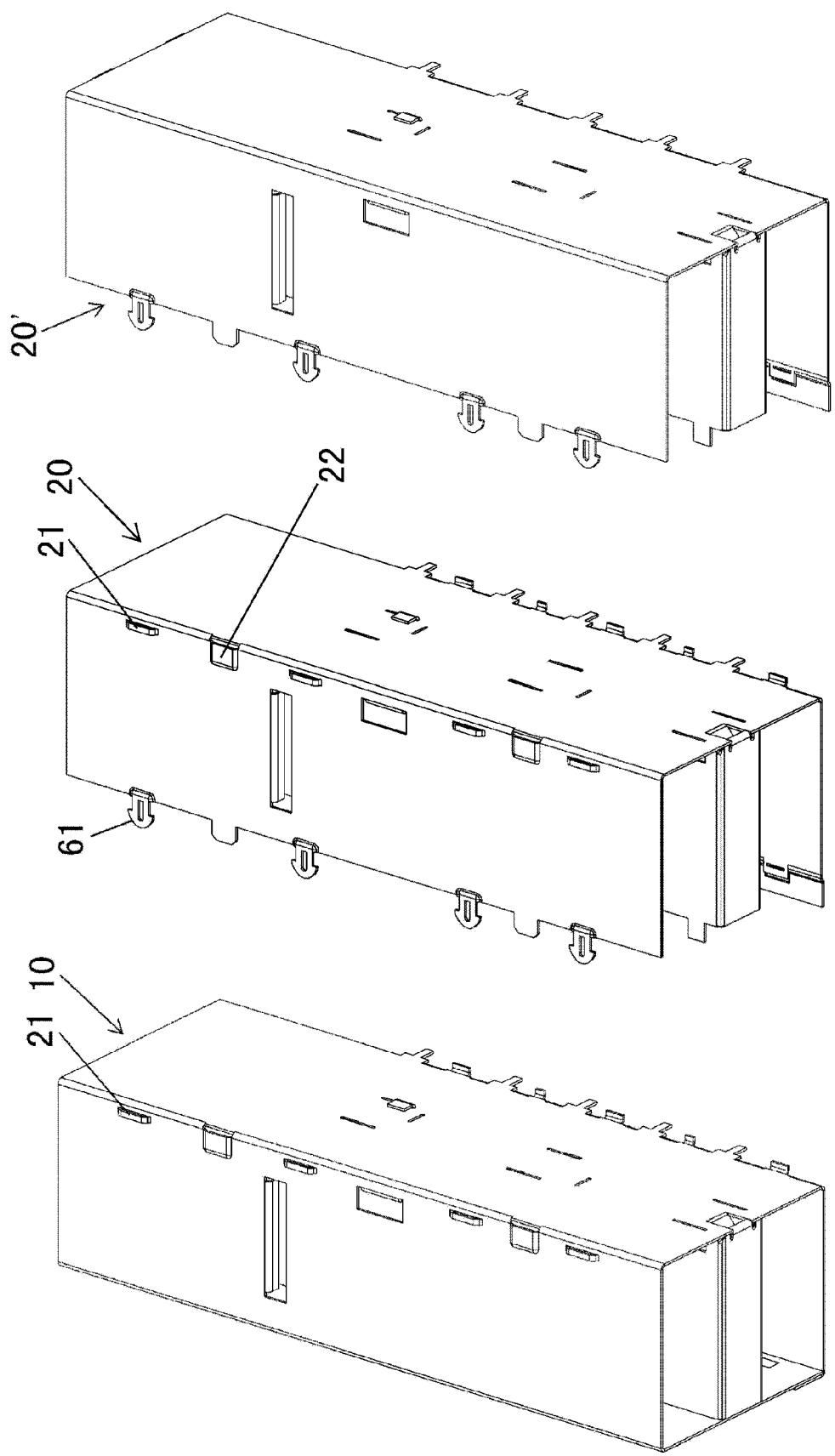
FIG. 7 is an exploded view of the housing assembly of FIG. 5.
Figure 8:
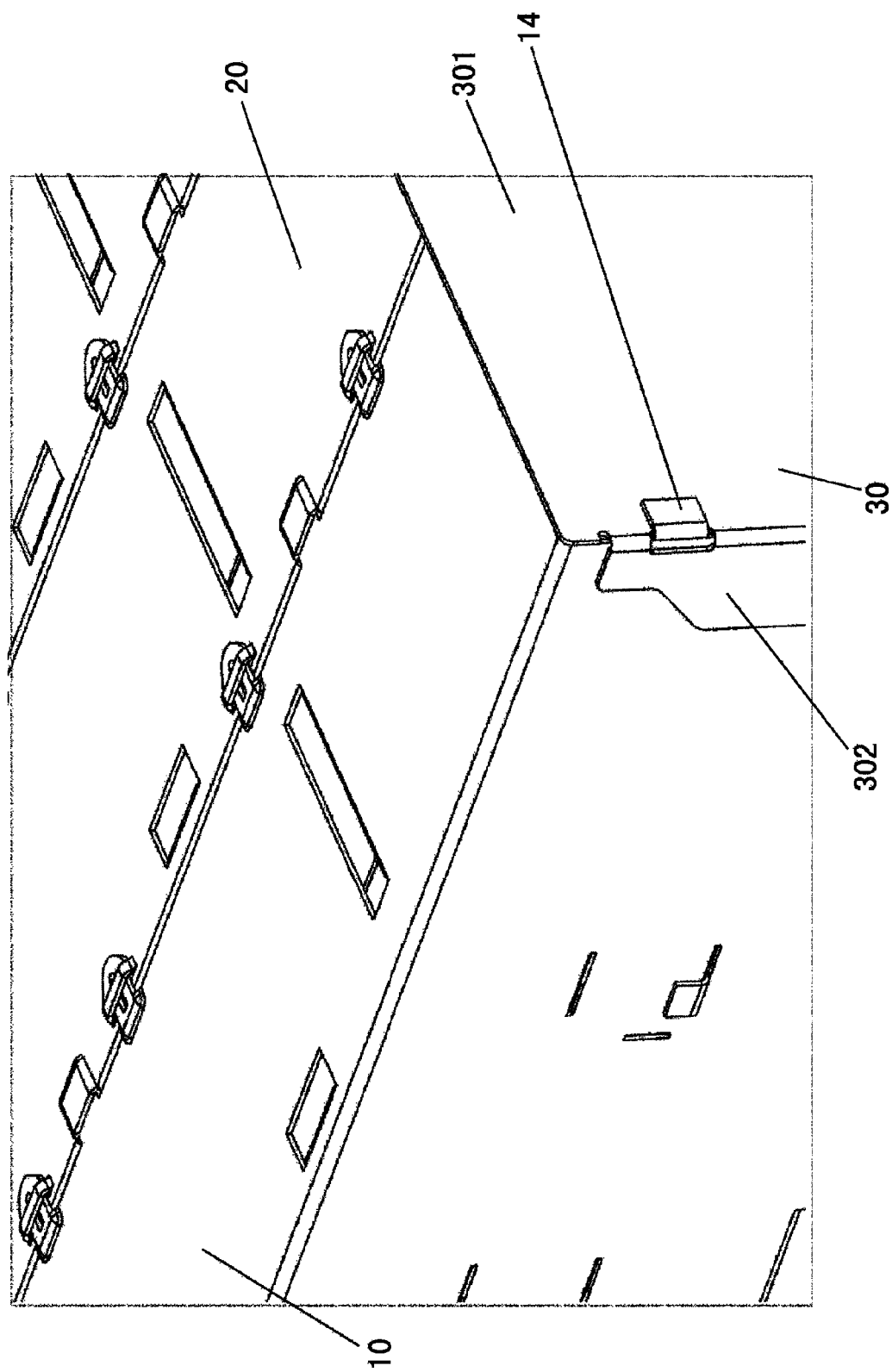
FIG. 8 is an enlarged view of a portion of an upper portion of the terminating end of the housing assembly of FIG. 6.
Figure 9:
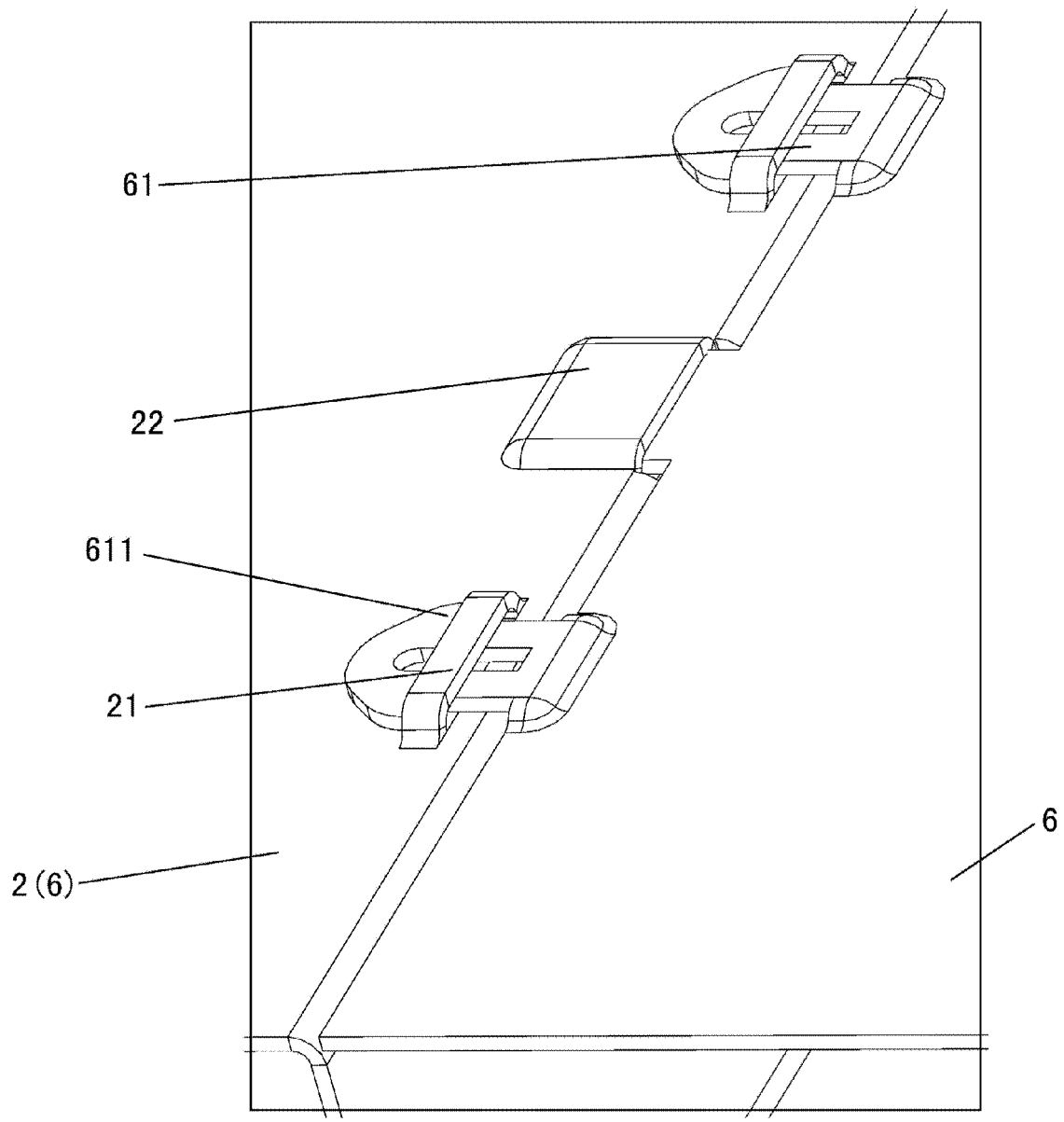
FIG. 9 is an enlarged view of another portion of the upper portion of the terminating end of the housing assembly of FIG. 6.

In the embodiments shown in FIGS. 7-9, a plurality of first latching protrusion receiving members 21 are positioned on the second edges of the first upper wall 2 of the base housing 10 and the second upper wall 6 of the secondary housings 20,20'. A plurality of complimentarily shaped first latching protrusions 61 are positioned on the first side of the second upper wall 6 of the secondary housings 20,20'. The first latching protrusions 61 engage the first latching protrusion receiving members 21 to connect the first secondary housing 20 with the base housing 10 or the second secondary housing 20' with the first secondary housing 20.

In the embodiments shown in FIGS. 7-9, the first latching protrusion receiving members 21 are coupled with the first latching protrusions 61 in a snap-fitting manner. The first latching protrusion receiving members 21 have an arch-like banded structure on the first upper wall 2 of the base housing 10 or the second upper wall 6 of the secondary housings 20,20'. The first latching protrusions 61 are tapered, having opposing latching spurs 611 that extend outward away from each other. The first latching protrusions 61 may pass through the arched structures of the first latching protrusion receiving members 21, so that the latching spurs 611 are rested against a first side of the arched structures. Thus, the first latching protrusions 61 cannot disengaged from the first latching protrusion receiving members 21 unless a predetermined force is exerted on it. As such, the base housing 10 and the first secondary housing 20, and the adjacent second secondary housing 20' may remain connected together. However, if a predetermined force is exerted, the first latching protrusions 61 may be disengaged from the first latching protrusion receiving members 21 due to elasticity of the first latching protrusions 61 and the protruding first connectors 21. As such, the base housing 10 and the first secondary housing 20, or the second secondary housing 20' may be detached.

Further, still referring to FIG. 9, a plurality of first connection slots 22 are positioned on the second edges of the first upper wall 2 and the second upper wall 6, and a plurality of complimentary first insertion members 62 are positioned on the first side of the second upper wall 6. The first insertion members 62 can be inserted into the first connection slots 22 of the base housing 10 or the first secondary housing 20.

Figure 10:
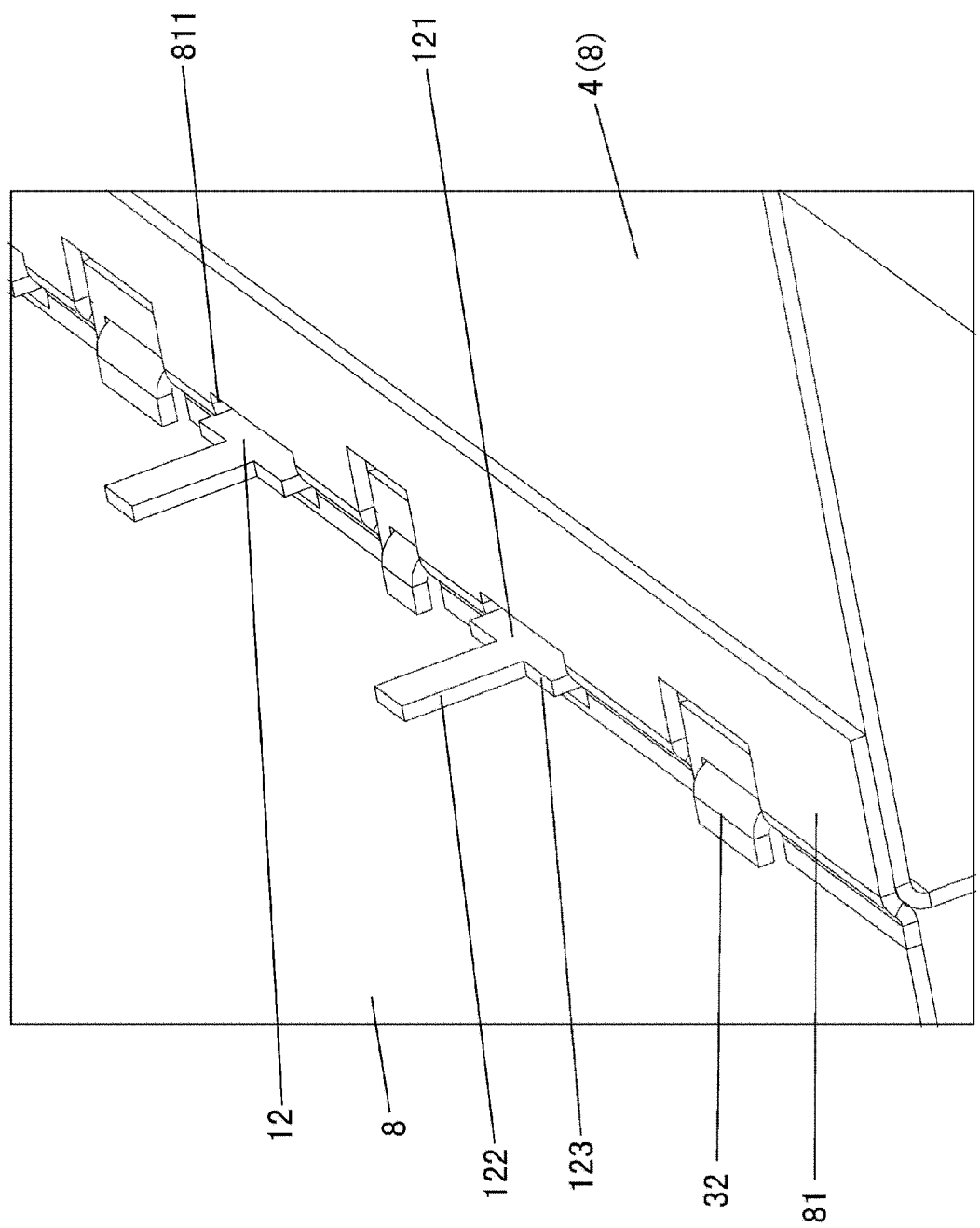
FIG. 10 is an enlarged view of a portion of a lower portion of the terminating end of the housing assembly of FIG. 6.

Referring to FIGS. 10 and 16, the free side of the second lower wall 8 of each secondary housing 20,20' is provided with a connection portion 81 formed by bending outward and extending horizontally the free side. The connection portion 81 is located at a lower surface of the first lower wall 4 or the second lower wall 8 of the secondary housing 20,20'. A lower surface of each second lower wall 8 is in the same plane with the lower surface of the first lower wall 4. Further, a plurality of pin receiving holes 811 are formed in the connection portion 81, and the first pins 12 of the base housing 10 or the second pins of the secondary housing 20,20' may be inserted into the pin receiving holes 811, to electrically connect with the circuit board (not shown).

In an embodiment shown in FIG. 10, each of the first pins 12 and the second pins 12 includes: a pin body 121 having a larger width, and a junction portion 122 extending from the pin body 121. A step portion 123 is formed between the pin body 121 and the junction portion 122. The step portion 123 extends outward beyond the lower surface of the connection portion 81 by a predetermined height, for example, 0.5 mm. Thus, a distance of approximate 0.5 mm is left between a bottom of the housing assembly 100,200 and the circuit board, to prevent the bottom of the housing assembly 100,200 from contacting with the circuit board and/or the electronic device on the circuit board.

In an embodiment, a plurality of second engagement members 32 are positioned on bottoms of the second wall 3 of the base housing 10 and the connecting wall 7 of each secondary housing 20,20'. Each second engagement members 32 passes through one corresponding pin receiving hole 811 and extends in parallel with the second lower wall 8. A lower surface of the second engagement members 32 is approximately aligned with a lower surface of the connection portion 81. Thus, the second engagement members 32 are constructed to connect the second lower wall 8 of the first secondary housing 20 with the first lower wall 4 of the base housing 10 or the second lower wall 8 of the second secondary housing 20' without increasing a thickness of the second lower wall 8 and the first lower wall 4, or a thickness of two second lower walls 8. For example, thicknesses of the second lower wall 8 and the first lower wall 4, or the two second lower walls 8 superposed on each other at the connection portion 81 are approximate 2.5 mm. Thus, a height from inner sides of the body portion of the second lower wall 8 and the first lower wall 4 to the circuit board is approximate 3.0 mm.

In the embodiment shown in FIGS. 12-15, a plurality of second insertion members 94 extend horizontally outward from both sides of the second upper partition wall 91 and the second lower partition wall 92, respectively. Correspondingly, a plurality of second insertion member receiving holes 71 are disposed in the connecting wall 7. The second insertion members 94 adjacent to the connecting wall 7 (on the right side in FIG. 12) are inserted into the second insertion member receiving holes 71 of the connecting wall 7 respectively. The first insertion members 62 positioned away from the connecting wall 7 are inserted into the first protrusion receiving holes 31 (FIG. 1) of the base housing 10, or the second insertion member receiving holes 71 in the next secondary housing.

Figure 12:
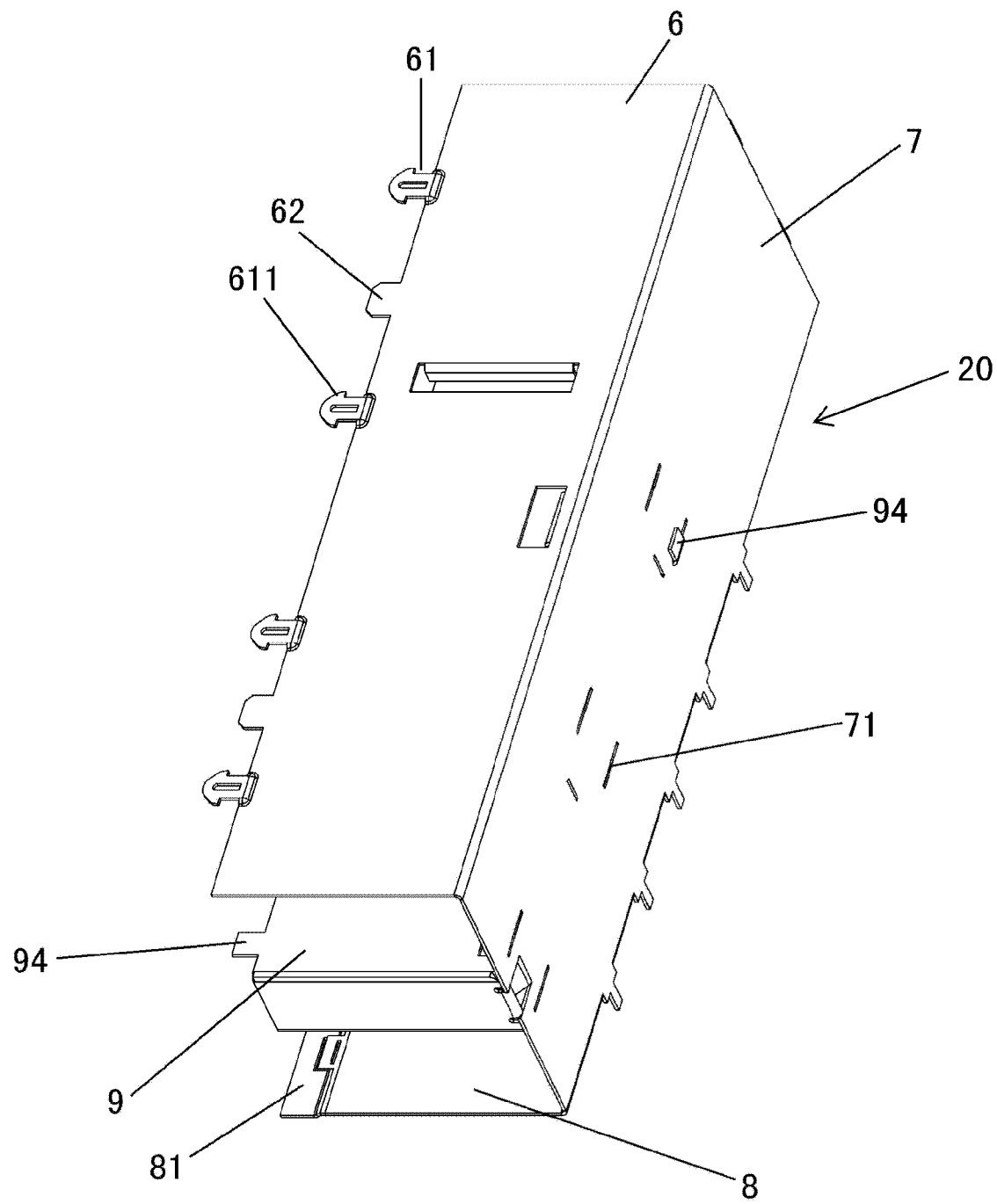
FIG. 12 is a perspective view of a receiving end of a secondary housing.
Figure 13:
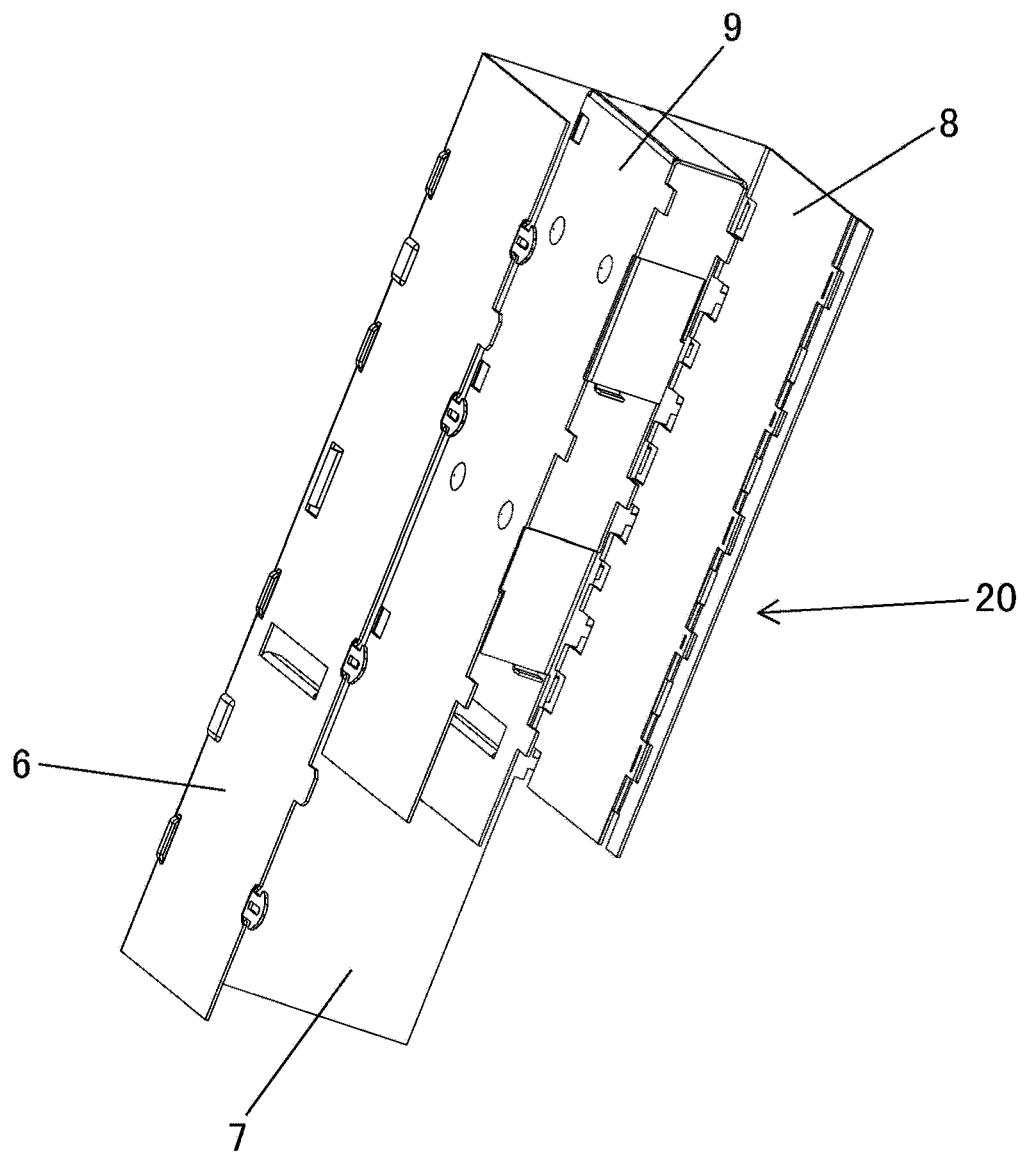
FIG. 13 is a perspective view of the secondary housing of FIG. 12.
Figure 14:
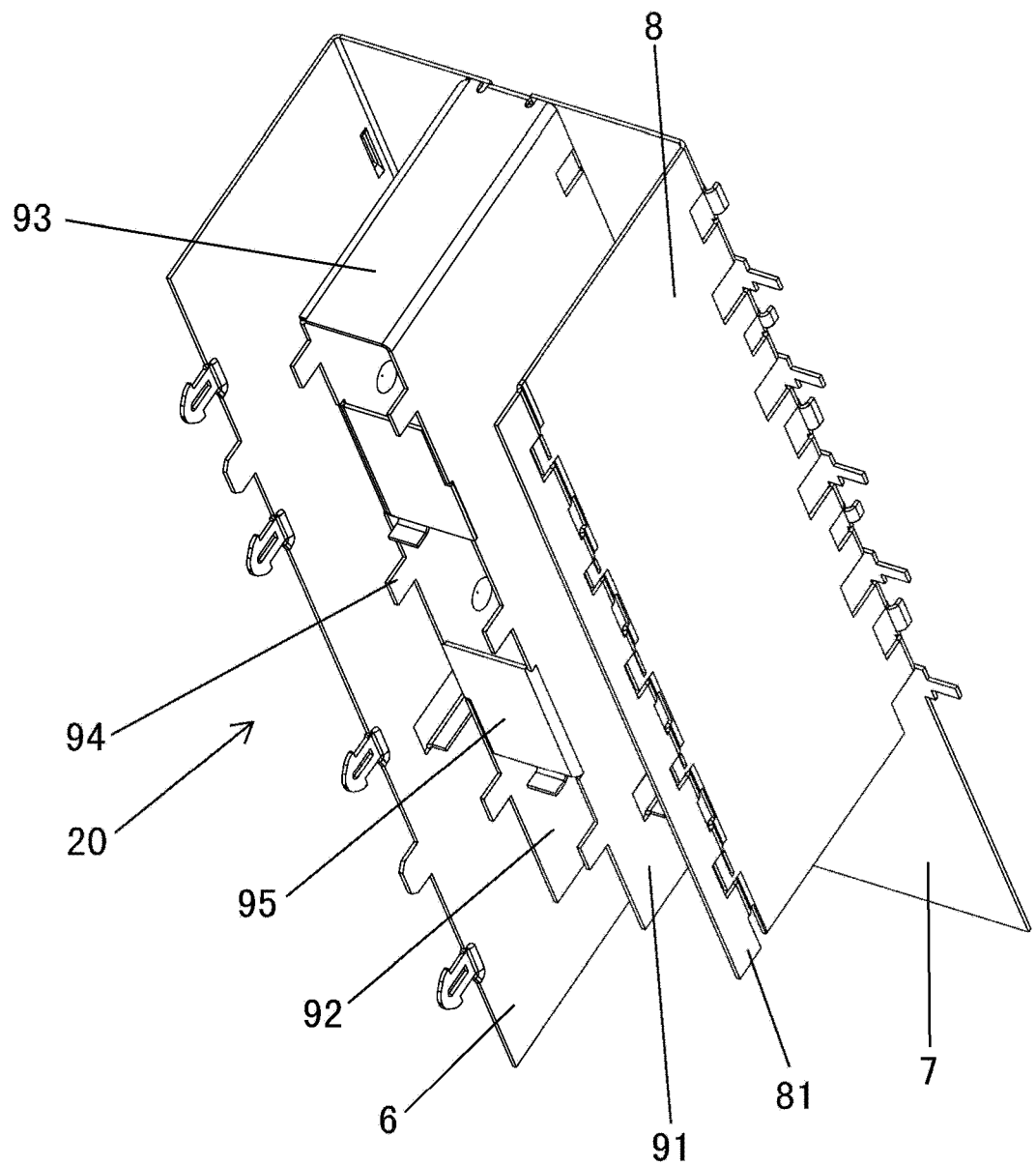
FIG. 14 is a perspective view of the secondary housing of FIG. 12.

In an embodiment shown in FIG. 12, a portion of the second insertion members 94 extend out the second insertion member receiving holes 71 of the connecting wall 7. These portions may be bent upward or downward, to support and connect the second upper partition wall 91 and the second lower partition wall 92 firmly on the connecting wall 7.

In an embodiment shown in FIGS. 4 and 16, a plurality of receiving slots 56, which are constructed to receive the second insertion members 94 of the first secondary housing 20 inserted from the second wall 3, respectively, are provided on the position corresponding to the second insertion members 94 away from the connecting wall 7 on the first upper partition wall 51 and the first lower partition wall 52. Similarly, a plurality of receiving slots 98, which are constructed to receive the second insertion members 94 of the second secondary housing 20', respectively, are provided on the position corresponding to the second insertion members 94 extending away from the connecting wall 7 on the second upper partition wall 91 and the second lower partition wall 92. Thus, each second insertion member 94 of the second secondary housing 20' extending away from the connecting wall 7 may be supported firmly on the second wall 3 of the base housing 10 or the connecting wall 7 of the first secondary housing 20.

In the embodiments shown in FIGS. 14-19, sides of the second upper partition wall 91 and the second lower partition wall 92, which are positioned away from the connecting wall 7, are provided with at least one second partition reinforcing bridge 95 extending perpendicularly from one of the second upper partition wall 91 and the second lower partition wall 92 towards the other of the second upper partition wall 91 and the second lower partition wall 92. The second partition reinforcing bridge 95 horizontally supports the second upper partition wall 91 and the second lower partition wall 92. Further, a free end 96 of the second partition reinforcing bridge 95 further extends perpendicularly beyond the outer side of the other of the second upper partition wall 91 and the second lower partition wall 92, and both sides 97 of the second partition reinforcing bridge 95 extend perpendicularly inward. The second partition reinforcing bridge 95 is supported between the second upper partition wall 91 and the second lower partition wall 92. Thus, a predetermined distance between the second upper partition wall 91 and the second lower partition wall 92 may be maintained by the second partition reinforcing bridge 95, to radiate heat generated from the electronic devices fixed in the device receiving spaces 40.

Figure 11:
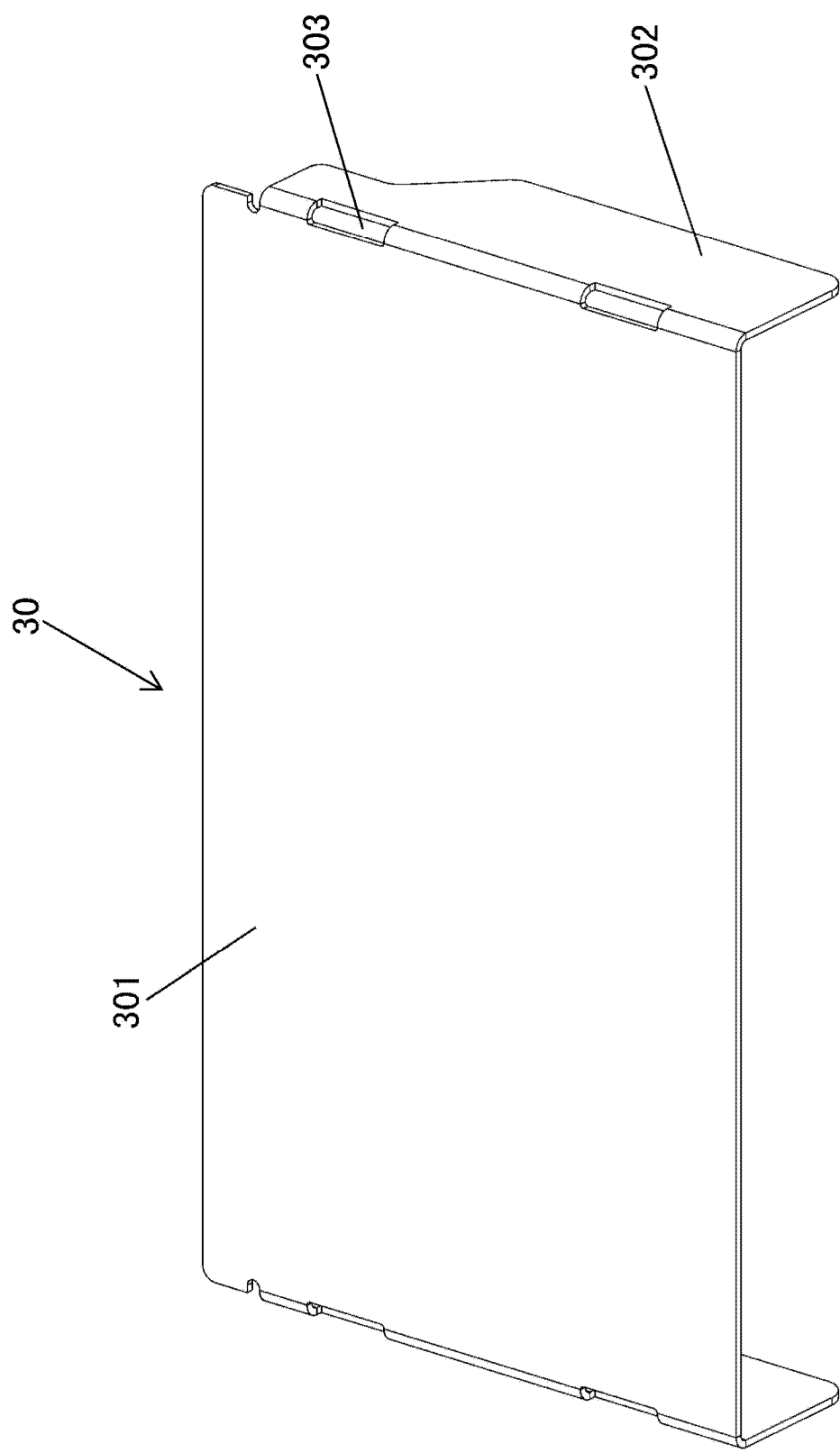
FIG. 11 is a perspective view of a terminating end cover.

In the embodiments shown in FIGS. 1, 6, 8 and 11, the housing assembly 100,200 further includes a terminating end cover 30 for covering the terminating end portion of the device receiving spaces 40. The terminating end of the housing assembly 100,200 is opposite the receiving end. As shown in FIG. 11, the terminating end cover 30 has a cover body 301 and a pair of wings 302 extending perpendicularly from two opposite ends of the cover body 301. The wings 302 extend continuously from the cover body 301, being bent therefrom. A plurality through holes 303 formed at connection interface between the cover body 301 and the wings 302. For example, in the housing assembly 200 shown in FIG. 6, first cover fastening tabs 14 extend from the terminating end portion of the first wall 1, and second cover fastening tabs 72 extending from the rear portion of the upright of the outermost secondary housing pass through the through holes 303, respectively, then the first cover fastening tabs 14 and the second cover fastening tabs 72 are bent relative to each other, respectively. An inner surface of each of the two wings 302 are rested against the outer sides of the first wall 1 and the last connecting wall 7, respectively, such that the terminating end cover 30 is fixed on the terminating end of the secondary housing 20,20'.

In an embodiment shown in FIG. 7, for the outermost second secondary housing 20', the first connectors 21, the connection slots 22 and the second connectors 32 (FIG. 10) may be omitted to simplify the entire housing assembly structure. The other structures of this secondary housing 20' are identical with that of first secondary housing 20 in the middle, so the detailed description thereof is omitted herein.

Referring to the embodiment shown in FIG. 7, the housing assembly includes a base housing 10 constructed to define device receiving spaces 40 in two rows and one column therein, and comprising a first wall 1, a first upper wall 2, a second wall 3 and a first lower wall 4, which are successive and integrally connected; and at least one secondary housing 20 or 20', Each secondary housing 20,20' includes a second upper wall 6, a connecting wall 7 and a second lower wall 8, which are successive and integrally connected, wherein free ends of the second upper wall 6 and the second lower wall 8 are connected to the first upper wall 2 and the first lower wall 4, or to the second upper wall 6 and the second lower wall 8 of the previous secondary housing, respectively. As such, each first secondary housing 20 and the second wall 3 of the base housing 10 or the connecting wall 7 of the second secondary housing 20' together define further device receiving spaces 40 arranged in two rows and one column.

A method for manufacturing a housing assembly according to any one of the above embodiments, includes the steps of: providing a first metal sheet; cutting the first metal sheet into a first portion and a second portion, wherein the second portion is integrally connected with the first portion at the position of the first partition connecting wall 53; forming the first wall 1, the first upper wall, the second wall 3 and the first lower wall, which are successively connected by forming indentations on the first portion; forming the first upper partition wall, the first partition connecting wall 53 and the first lower partition wall, which are successively connected, by forming indentations on the second portion; bending the first upper partition wall and the first lower partition wall perpendicularly, respectively with respect to the first partition connecting wall 53; bending the first partition connecting wall 53 at the connection position between the first portion and the second portion, such that sides of the first upper partition wall and the first lower partition wall are supported on the second wall 3; and folding the first upper wall, the first wall 1 and the first lower wall, such that the other sides of the first upper partition wall and the first lower partition wall are supported on the first wall 1, and free sides of the first wall 1 and the first lower wall are connected with each other, thereby forming the base housing 10.

In another embodiment, the manufacturing method for manufacturing a housing assembly according to any of the above embodiments includes the steps of: providing a second metal sheet; cutting the second metal sheet into a third portion and a fourth portion, wherein the fourth portion is integrally connected with the third portion at the position of the second partition connecting wall 93; forming the second upper wall, the connecting wall and the second lower wall, which are successively connected, by forming indentations on the third portion; and forming the second upper partition wall, the second partition connecting wall 93 and the second lower partition wall, which are successively connected, by forming indentations on the fourth portion; bending the second upper partition wall and the second lower partition wall perpendicularly with respect to the second partition connecting wall 93, respectively; bending the second partition connecting wall 93 at the connection position between the third portion and the fourth portion, such that sides of the second upper partition wall and the second lower partition wall are supported on the connecting wall; and folding the second upper wall, and the second lower wall, thereby forming the secondary housing 20,20'; and connecting the second upper wall and the second lower wall of the secondary housing 20,20' with the first upper wall and the first lower wall on the second wall 3 of the base housing, respectively.

In an embodiment, at least one or more secondary housings 20,20' is connected with the connected secondary housing 20,20' successively.

Figure 17:
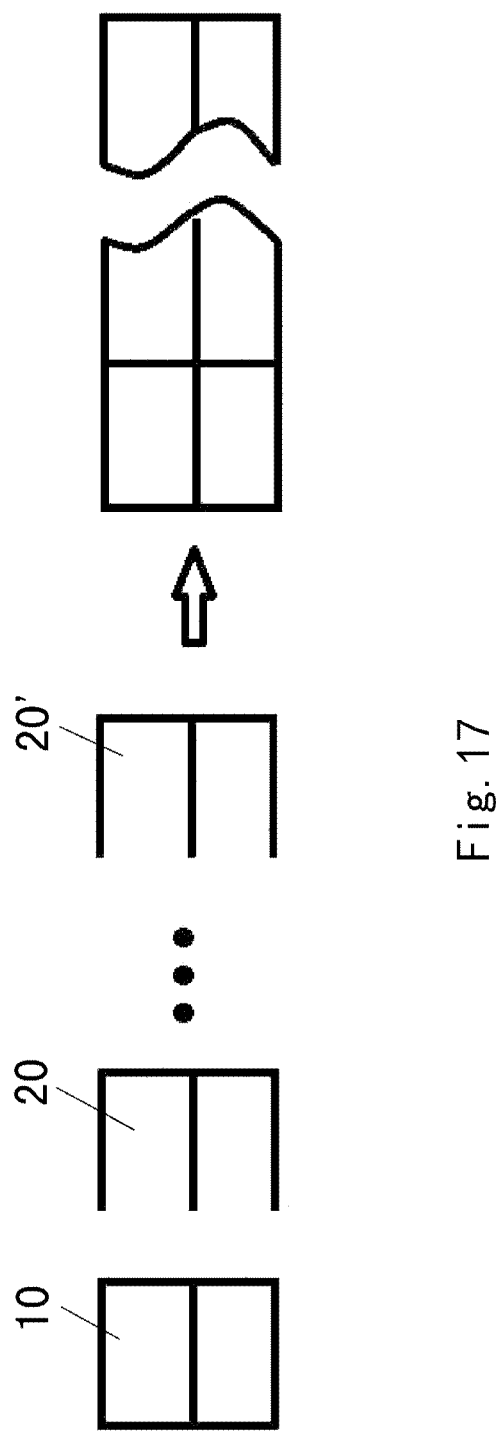
FIG. 17 is a diagram of the operations for forming a housing assembly with 2×N device receiving spaces.

In an embodiment of FIG. 17, a diagram of operations is shown for manufacturing a housing assembly with 2×N device receiving spaces. The formed first secondary housing 20 is connected to the formed base housing 10; then, the next second secondary housing 20' is connected to the previous connected secondary housing 20; yet another secondary housing 20,20' may be connected as necessary; at last, the last second secondary housing 20' is connected to the previously connected secondary housing 20,20'. Thereby, the housing assembly with 2×N device receiving spaces is formed.

Figure 18:
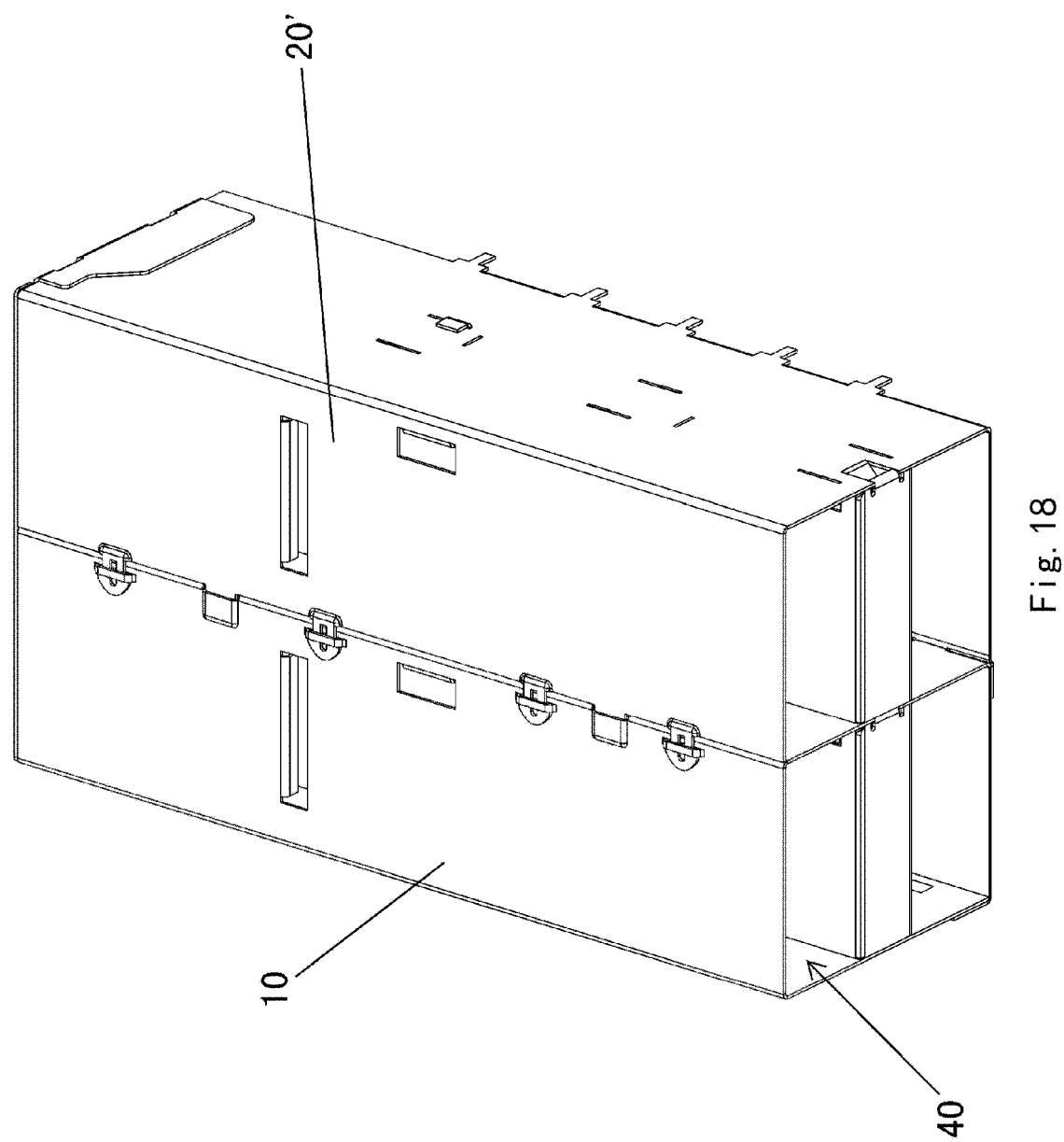
FIG. 18 is a perspective view of a third housing assembly.

In an embodiment shown in FIG. 18, the housing assembly has one base housing 10 and one secondary housing 20,20', and has 2×2 device receiving spaces 40.

Figure 19:
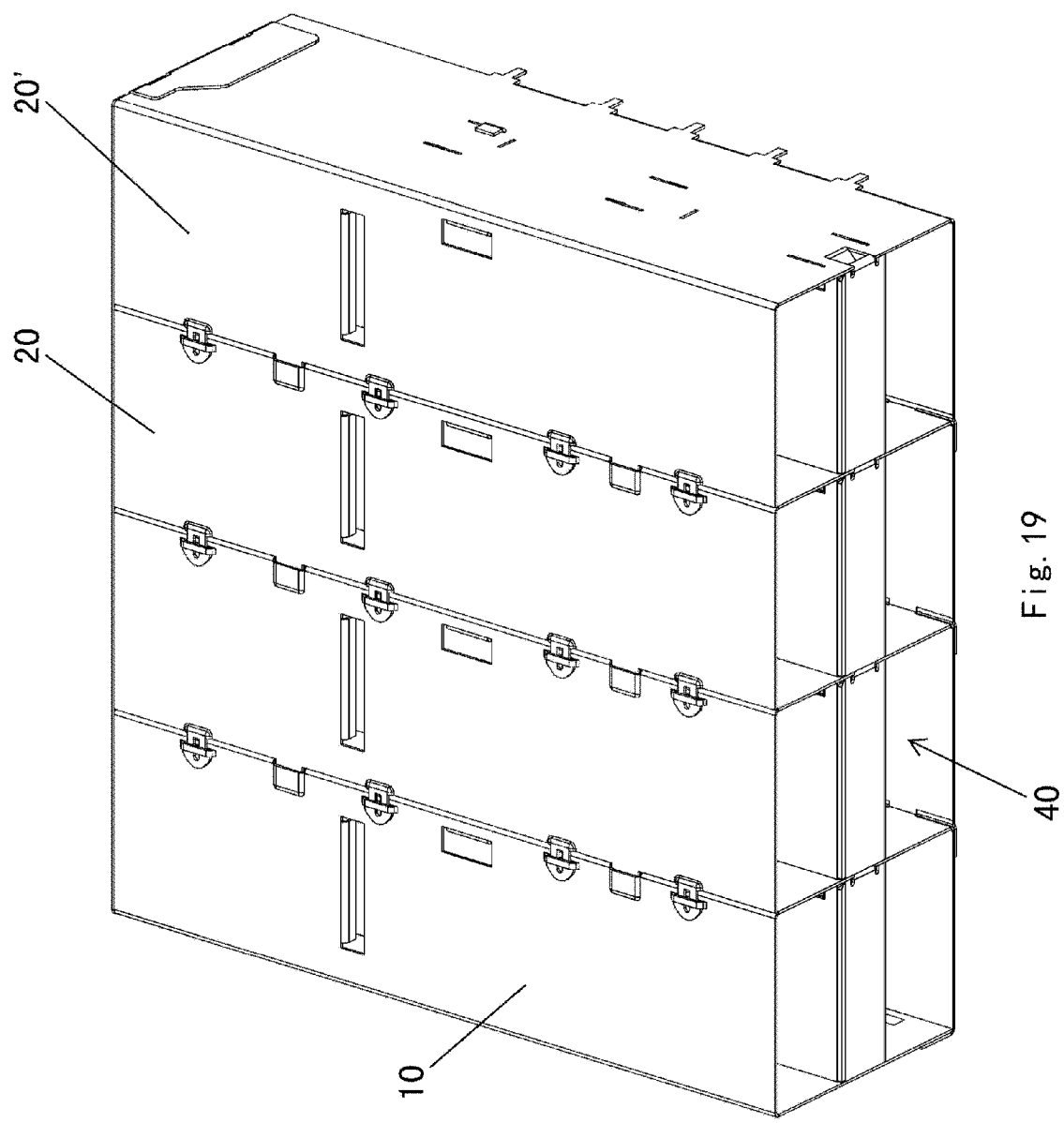
FIG. 19 is a perspective view of a fourth housing assembly.

In an embodiment shown in FIG. 19, the housing assembly has one base housing 10 and three secondary housings 20,20', and has 2×4 device receiving spaces 40.

Figure 20:
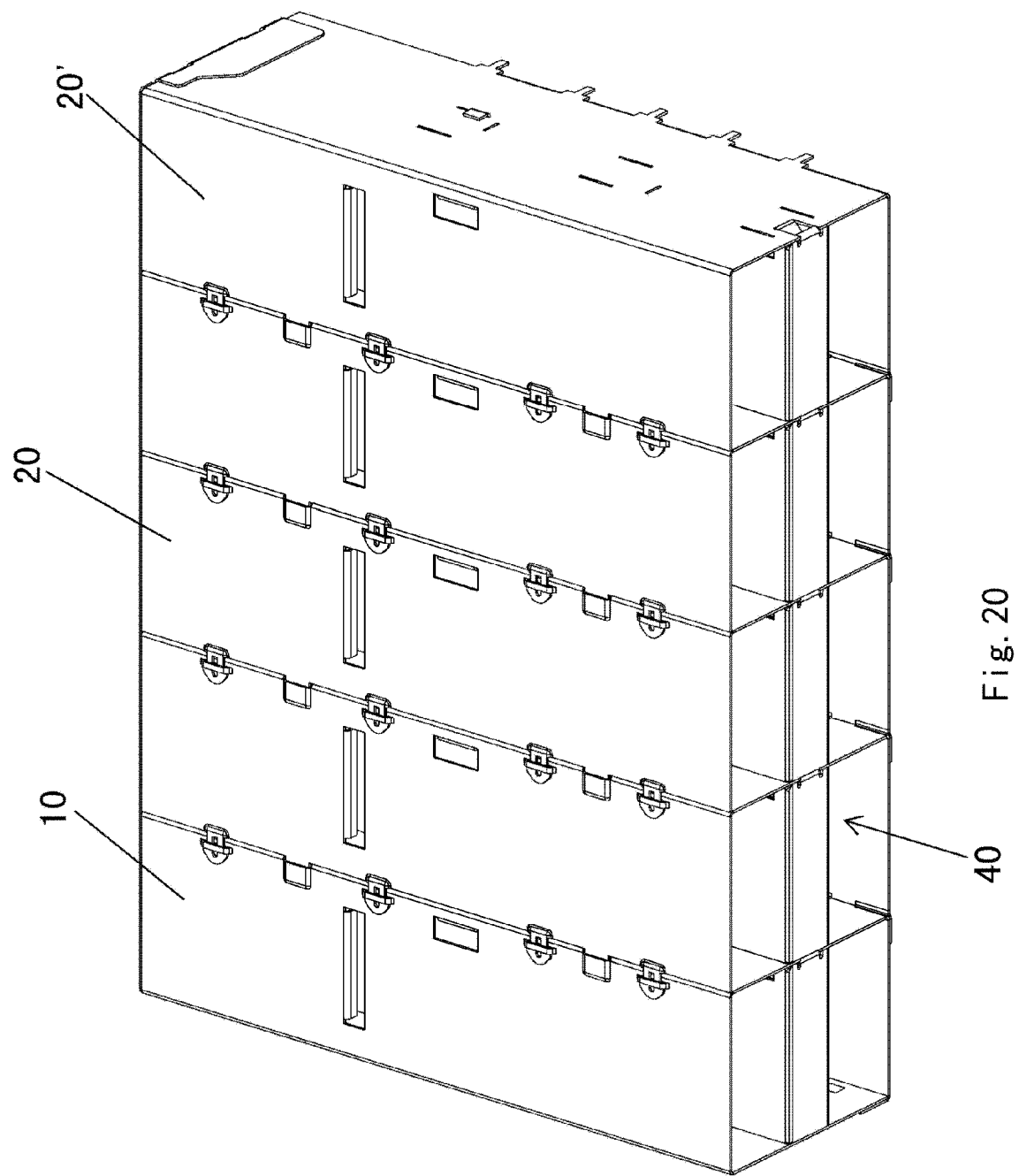
FIG. 20 is a perspective view of a fifth housing assembly.

In an embodiment shown in FIG. 20, the housing assembly has one base housing 10 and four secondary housings 20,20', and has 2×5 device receiving spaces 40.

In an embodiment shown in FIG. 21, the housing assembly has one base housing and five secondary housings 20,20', and has 2×6 device receiving spaces 40.

Although the above embodiments disclose that the base housing 10 and each secondary housing 20,20' of the housing assembly 100,200 both have the upper device receiving spaces 40 and the lower device receiving spaces 40, the present invention is not limited to this. In another embodiment, the partition 5 may be omitted in the base housing 10 and the secondary housing 20,20', i.e., the base housing 20 and each secondary housing 20,20' both have only one device receiving space 40, thereby form 1×N device receiving spaces. In this embodiment, the second upper wall and the second lower wall of the secondary housing 20,20' are detachably fixed onto the first upper wall and the first lower wall outside the second wall 3 of the base housing, respectively, so that one device receiving space 40 is surrounded by the second wall 3 of the base housing 10 together with the second upper wall, the second lower wall and the connecting wall of the secondary housing 20,20'.

In another embodiment, the base housing 10 and each secondary housing 20,20' both have three or four device receiving spaces 40, and two adjacent device receiving spaces 40 in the same column are partitioned by partitions 5, to form 3×N, or 4×N device receiving spaces 40. In addition, the partition connecting wall of the partition 5 of the base housing 10 and the second wall 3 also may not be formed integrally.

The base housing 10 and the secondary housings 20,20' are both made of a single sheet of metal sheet, and a different number of the secondary housings 20,20' may be connected successively to the base housing 10 depending on requirement, thereby a housing assembly with M×N device receiving spaces is formed to accommodate M×N electronic devices, wherein M and N both are natural number. The base housing 10 and the secondary housings 20,20' have the same outer shape, and may be manufactured using one set of mold, the connection between the base housing 10 and the secondary housing 20,20', and between the secondary housings 20,20' may be achieved by snap-fitting, insertion or welding, it has advantages of simply manufacturing process, easy automatic assembly, and low manufacturing cost.

Those of ordinary skill in the art would appreciate that the above embodiments are intended to be exemplary, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" or "an embodiment" are not intended to be interpreted as excluding the existence of additional embodiments that also incorporate the recited features. Moreover, unless explicitly stated to the contrary, embodiments "comprising" or "having" or "including" an element or a plurality of elements having a particular property may include additional such elements not having that property. Additionally, the reference to a "first" or "second" or "third" or "fourth" element should be understood to identify an additional identified structure and not a quantity of that element, unless otherwise explicitly stated.

What is claimed is:

1. A housing assembly for electronic devices, comprising:
    (a) a base housing having:
        (1) a first upper wall,
        (2) a first lower wall,
        (3) a first wall,
        (4) a second wall, and
        (5) a first device receiving space, and
    (b) a first secondary housing detachably mounted to an outer side of the second wall, and having:
        (1) a second upper wall,
        (2) a second lower wall,
        (3) a connecting wall, and (4) a second device receiving space defined by the second wall together with the second upper wall, the second lower wall and the connecting wall, and (5) a first partition:
 (i) positioned between the first upper wall and the first lower wall,
 (ii) extending from the first wall and the second wall to divide an interior of the base housing into an upper device receiving space and a lower device receiving space, and
 (iii) having:
  (1) a first upper partition wall,
  (2) a first lower partition wall, and
  (3) a first partition connecting wall positioned between the first upper partition wall and the first lower partition wall, being bent inward from one of the first wall and the second wall such that the first partition has an approximate U-shape.

2. The housing assembly according to claim 1, wherein:
(a) opposite sides of the first upper partition wall and the first lower partition wall have a plurality of first protrusions extending horizontally outward therefrom; and
(b) the first wall and the second wall each have a plurality of first protrusion receiving holes into each of which one corresponding first protrusion is inserted.

3. The housing assembly according to claim 2, wherein first sides of the first upper partition wall and the first lower partition wall have at least one first partition reinforcing bridge which extends perpendicularly from one of the first upper partition wall and the first lower partition wall towards the other of the first upper partition wall and the first lower partition wall.

4. The housing assembly according to claim 3, wherein each first partition reinforcing bridge has:
(a) a free end extending perpendicularly to, and abutting against, an outer side of the other of the first upper partition wall and the first lower partition wall; and
(b) opposite sides extending perpendicularly inward, with the first upper partition wall and the first lower partition wall supporting the first partition reinforcing bridge therebetween.

5. The housing assembly according to claim 1, further comprising a plurality of outwardly extending first pins positioned on an edge of the first wall and the second wall.

6. A housing assembly for electronic devices, comprising:
(a) a base housing having:
 (1) a first wall having a plurality of engaging protrusions or first engaging slots,
 (2) a second wall,
 (3) a first upper wall,
 (4) a first lower wall having a free edge bent into a folded edge that:
  (i) rests against an outer side of the first wall, and
  (ii) has a plurality of engaging slots or engaging protrusions mated with the engaging protrusions or first engaging slots of the first wall,
 (5) a first device receiving space; and
(b) a first secondary housing detachably mounted to an outer side of the second wall, and having:
 (1) a second upper wall,
 (2) a second lower wall,
 (3) a connecting wall, and
 (4) a second device receiving space defined by the second wall together with the second upper wall, the second lower wall and the connecting wall of the first secondary housing.

7. The housing assembly according to claim 6, wherein the secondary housing further includes a second partition supported on an approximate middle position between the second upper wall and the second lower wall by the connecting wall and the first second wall, dividing the interior of the secondary housing into:
(a) an upper device receiving space, and
(b) a lower device receiving space and having:
 (a) a second upper partition wall,
 (b) a second lower partition wall, and
 (c) a second partition connecting wall positioned between the second upper partition wall and the second lower partition wall, being inward from the connecting wall such that the second partition has an approximate U-shape.

8. The housing assembly according to claim 7, wherein:
(a) second edges of the first upper wall and the second upper wall each have a plurality of first latching protrusion receiving members; and
(b) the second upper wall has a plurality of complimentary first latching protrusions coupled with the first latching protrusion receiving members, connecting the secondary housing and the base housing or the next secondary housing together.

9. The housing assembly according to claim 8, wherein the first latching protrusion receiving members are coupled with the first latching protrusions in a snap-fitting manner.

10. The housing assembly according to claim 9, wherein:
(a) the first latching protrusion receiving members are arched and positioned on the first upper wall or the second upper wall; and
(b) the first latching protrusions have opposing latching spurs extending outward in opposite directions, and passing through the first latching protrusion receiving members, being retained therein.

11. The housing assembly according to claim 8, wherein:
(a) the second edges of the first upper wall and the second upper wall each have a plurality of first connection slots; and
(b) the second upper wall has a plurality of complimentary first insertion members inserted into the first connection slots of the base housing or of a mounted first or second secondary housing.

12. The housing assembly according to claim 7, further comprising a connection portion:
(a) positioned on a free side of the second lower wall,
(b) bending outward,
(c) extending horizontally, and
(c) having an inner surface contacting an outer surface of either the first lower wall of the base housing or the second lower wall of an attached secondary housing.

13. The housing assembly according to claim 12, wherein
(a) the connection portion has a plurality of pin receiving holes; and
(b) the base housing has a plurality of complimentary first pins inserted into the pin receiving holes and electrically connecting with a circuit board.

14. The housing assembly according to claim 13, wherein, each of the first pins includes:
(a) a pin body;
(b) a junction portion extending from the pin body; and
(c) a stepped portion positioned between the pin body and the junction portion and extending beyond an outer surface of the connection portion by a predetermined height.

15. The housing assembly according to claim 13, wherein the second wall of the base housing and the connecting wall of each secondary housing have a plurality of second engagement members:
(a) passing through one of the pin receiving holes disposed on the connection portion,
(b) extending in parallel with the second lower wall, and
(c) having an outer surface of the second engagement members being approximately coplanar with an outer surface of the connection portion.

16. The housing assembly according to claim 7, wherein:
(a) opposing sides of the second upper partition wall and the second lower partition wall each have a plurality of second insertion members extending horizontally outward; and
(b) the connecting wall includes a plurality of second insertion member receiving holes having:
 (1) second insertion members positioned adjacent to the connecting wall being inserted therein, and
 (2) second insertion members positioned away from the connecting wall being inserted into first protrusion receiving holes disposed in the second wall of the base housing, or second insertion member receiving holes disposed in an attached secondary housing.

17. The housing assembly according to claim 16, wherein a side of the second upper partition wall and a side of the second lower partition wall positioned away from the connecting wall have at least one second partition reinforcing bridge extending perpendicularly from one of the second upper partition wall and the second lower partition wall towards the other of the second upper partition wall and the second lower partition wall, being horizontally supported and connected to the second upper partition wall and the second lower partition wall.

18. The housing assembly according to claim 17, wherein:
(a) the second partition reinforcing bridge has a free end further extending perpendicularly beyond an outer side of the other of the second upper partition wall and the second lower partition wall, and
(b) both sides of the second partition reinforcing bridge extend perpendicularly inward, being supported between the second upper partition wall and the second lower partition wall.

19. A housing assembly for electronic devices, comprising:
(a) a base housing having:
 (1) a first wall,
 (2) a second wall,
 (3) first upper wall,
 (4) a first lower wall having a free edge bent into a folded edge that rests against an outer side of the first wall, and
 (5) a first device receiving space; and
(b) a first secondary housing detachably mounted to an outer side of the second wall, and having:
 (1) a second upper wall,
 (2) a second lower wall,
 (3) a connecting wall, and
 (4) a second device receiving space defined by the second wall together with the second upper wall, the second lower wall and the connecting wall.

20. The housing assembly according to claim 19, wherein:
(a) the folded edge has a plurality of first engaging slots or first engaging protrusions, and
(b) the first wall has a plurality of complimentary first engaging protrusions or first engaging slots mated with the first engaging slots or first engaging protrusions on the folded edge.

* * * * *